United States Patent
Lane

(10) Patent No.: US 10,993,334 B2
(45) Date of Patent: Apr. 27, 2021

(54) METHODS FOR LASER WELDING LAYERS OF CIRCUITRY PATTERN IN THE REEL-TO-REEL FABRICATION OF FLEXIBLE PRINTED CIRCUITS

(71) Applicant: Manaflex, LLC, Waikoloa, HI (US)

(72) Inventor: Robert Clinton Lane, Waikoloa, HI (US)

(73) Assignee: Manaflex, LLC, Waikoloa, HI (US)

(*) Notice: Subject to any disclaimer, the term of this patent is extended or adjusted under 35 U.S.C. 154(b) by 0 days.

(21) Appl. No.: 16/909,877

(22) Filed: Jun. 23, 2020

(65) Prior Publication Data

US 2021/0092854 A1    Mar. 25, 2021

Related U.S. Application Data

(60) Provisional application No. 62/903,343, filed on Sep. 20, 2019.

(51) Int. Cl.
*H05K 3/46* (2006.01)
*H05K 3/00* (2006.01)

(52) U.S. Cl.
CPC ......... *H05K 3/4658* (2013.01); *H05K 3/0026* (2013.01); *H05K 3/4655* (2013.01); *H05K 2203/0195* (2013.01); *H05K 2203/063* (2013.01); *H05K 2203/107* (2013.01); *H05K 2203/1105* (2013.01); *H05K 2203/1131* (2013.01); *H05K 2203/128* (2013.01); *H05K 2203/1453* (2013.01)

(58) Field of Classification Search
CPC ........ H05K 3/00; H05K 3/4644; H05K 3/025; H05K 1/0393; H05K 3/1283; H05K 13/0417; H05K 2201/0355
See application file for complete search history.

(56) References Cited

U.S. PATENT DOCUMENTS

| | | | |
|---|---|---|---|
| 6,881,923 B2 * | 4/2005 | Battaglia | B23K 26/0838 219/121.67 |
| 7,497,004 B2 * | 3/2009 | Cote | B32B 38/10 156/277 |
| 7,633,035 B2 | 12/2009 | Kiermeier | |
| 8,510,934 B2 | 8/2013 | Brand | |

(Continued)

FOREIGN PATENT DOCUMENTS

| | | |
|---|---|---|
| CN | 203715762 U | 7/2014 |
| WO | WO2019150740 A1 | 8/2019 |

OTHER PUBLICATIONS

Nagarajan Palavesam et al 2018 Flex. Print. Electron. 3 014002.

*Primary Examiner* — Minh N Trinh
(74) *Attorney, Agent, or Firm* — WPAT Law, P.C.; Anthony King

(57) ABSTRACT

A method of layering a layer of circuitry pattern to another layer of circuitry pattern during the manufacturing of a multilayer flexible printed circuit in a reel-to-reel machine. The method includes feeding both layers of circuitry pattern reel-to-reel into the machine, placing a layer of dielectric sheet material on the fly between the two layers of circuitry patterns reel-to-reel, followed by simultaneously passing the two layers of circuitry pattern and the dielectric sheet material under a laser scanner in the reel-to-reel machine to irradiate a laser beam on a layer of circuitry pattern to weld the two layers of circuitry patterns together.

16 Claims, 20 Drawing Sheets

(56) References Cited

U.S. PATENT DOCUMENTS

| | | |
|---|---|---|
| 8,931,166 B2 | 1/2015 | Marttila |
| 9,671,352 B2 * | 6/2017 | Woo .................... G01N 21/8901 |
| 10,008,403 B2 * | 6/2018 | Rumsby ............ H01L 21/67739 |
| 2011/0001670 A1 * | 1/2011 | Coleman ................. H05K 3/041 |
| | | 343/700 MS |
| 2013/0055555 A1 * | 3/2013 | Forster ............. G06K 19/07718 |
| | | 29/600 |
| 2019/0218142 A1 * | 7/2019 | Logunov ................. C03C 27/06 |

* cited by examiner

METHODS FOR LASER WELDING LAYERS OF CIRCUITRY PATTERN IN THE REEL-TO-REEL FABRICATION OF FLEXIBLE PRINTED CIRCUITS

CROSS-REFERENCE TO RELATED APPLICATIONS

This application claims priority to, and is a non-provisional patent application of U.S. Provisional Patent Application No. 62/903,343, filed on Sep. 20, 2019, which is hereby incorporated by reference in its entirety.

FIELD OF THE DISCLOSURE

The present disclosure relates to renewable energy technologies in general, and more specifically a FPC (flexible printed circuit) fabrication processes for the electric vehicle industry.

BACKGROUND OF THE DISCLOSURE

Known methods to produce a FPC (flexible printed circuit) include using a gantry. Such manufacturing process is stop and go, and may require manual intervention.

There is a continuing need for faster ways to produce a FPC.

Known methods to produce a FPC include environmentally hazardous processes such as chemical etching and wasteful use of debonding sheets.

There is a continuing need for environmentally friendlier and/or more cost-effective ways to produce a FPC.

International patent application number WO20191507401, U.S. Pat. No. 8,931,166 6, and China published patent application No. CN 203715762, all which are herein incorporated by reference in their entireties, disclose reel-to-reel manufacturing method for a variety of goods. These disclosures, however, do not address all of the environment issues and cost-effectiveness issues.

U.S. Pat. No. 7,633,035 issued to Kirmeier, U.S. Pat. No. 8,510,934 issued to Brand, and non-patent literature entitled Roll-to-Roll Processing of Film Substrates for Hybrid Integrated Flexible Electronics (Nagaraj an Palavesam et al 2018 Flex. Print. Electron. 3 014002) also disclosure related subject matters, all of which are herein incorporated by reference in their entireties.

All referenced patents, applications and literatures are incorporated herein by reference in their entireties. Furthermore, where a definition or use of a term in a reference, which is incorporated by reference herein, is inconsistent or contrary to the definition of that term provided herein, the definition of that term provided herein applies and the definition of that term in the reference does not apply. The disclosed embodiments may seek to satisfy one or more of the above-mentioned needs. Although the present embodiments may obviate one or more of the above-mentioned needs, it should be understood that some aspects of the embodiments might not necessarily obviate them.

BRIEF SUMMARY OF THE DISCLOSURE

In a general implementation, a reel-to-reel manufacturing method and device that produces flexible printed circuits (FPC) is disclosed. The contemplated manufacturing method can be implemented in a reel-to-reel machine where a continuous metal foil is fed into the reel-to-reel machine. The outcome at the trailing end of the reel-to-reel machine can include, but not limited to, 1) punched-out pieces of single-layer flexible printed circuits as an end product ready for industry use, 2) punched-out pieces of single-layer flexible printed circuits as an intermediary product ready to be layered with other pieces of flexible printed circuit to eventually produce multi-layer flexible printed circuits for industry use, 3) a continuous sheet of multiple pieces of flexible printed circuits still attached to each other, wherein the entire sheet is an intermediary product ready to be layered up to another sheet of similar intermediary product to eventually produce multi-layer flexible printed circuits, 4) punched-out pieces of multi-layer flexible printed circuits as the end product ready for industry use.

In one aspect combinable with the general implementation, a novel laser ablation process to create a circuitry pattern in a reel-to-reel process and/or within a reel-to-reel machine where a sheet material is continuously fed into the reel-to-reel machine is disclosed. The laser ablation is contemplated to replace the need for chemical etching which can be costly and environmental hazardous. Contemplated laser ablation process eliminates the need to chemically wash away metal.

Generally, the fabrication process may start with 1) a metal foil already on a UV debonding sheet (a sacrificial substrate), 2) a metal foil already on a thermal debonding sheet (a sacrificial substrate), or 3) a metal foil already on a plastic laminate. The contemplated types of laser ablate the outer edges of the intended circuitry pattern as the metal foil passes reel-to-reel under a laser scanner within the reel-to-reel machine.

There are at least two contemplated ways of laser ablation: 1) ablating a certain depth using one type of laser followed by another type of laser to cut a further depth, and 2) ablating through the entire thickness of the metal foil using one laser, following by another laser to refine the ablated edges.

Contemplated laser types include a green laser to ablate a metal pattern on the fly, which can ablate the metal foil without damaging any substrate underneath the metal foil, such as the plastic laminate. Green laser has a high absorption for and can enable at least copper, aluminum, and nickel ablation. It can ablate metal foil more efficiently. A high-power green laser is particularly contemplated to ablate most depth of the metal foil at first in one pass or more than one pass. 1 um fiber lasers can also be used for this first pass specifically for aluminum. Then a UV laser, more precise green laser, or ultrafast lasers (pico, femtosecond, etc.) can be used to ablate the remaining thickness of the metal foil without damaging the underlying substrate. One reason for this is so that the underlying substrate (e.g., UV debonding sheet, thermal debonding sheet) may be recycled and reused in the future. More importantly, carbon contamination will not occur as much.

There are various ways to remove the negative material resulting from the last ablation, depending on various factors. In the contemplated situation where the metal foil started out on a UV debonding sheet, it is contemplated that at some point during the fabrication process (e.g., before or after the laser ablation process), a top UV laminate or thermoset laminate coverlay can be applied on top of the metal foil. Subsequently, UV laser light can be irradiated onto the UV debonding sheet from underneath to precisely just the area of the circuitry pattern, thereby debonding the portion of the UV debonding sheet from the circuitry pattern of the metal foil. In some embodiments, the UV laser irradiates an area of the UV debonding sheet that entirely or substantially corresponds to the area of the circuitry pattern.

Further downstream the reel-to-reel conveyor system, the UV debonding sheet can be peeled away from the metal foil, effectively removing the negative material (which is adhered to the UV debonding sheet) from the metal foil.

In the situation where the fabrication process started out with a metal foil already on a thermal debonding sheet, the contemplated process to remove the negative material can be similar to the above. At some point during the fabrication process (e.g., before or after the laser ablation process), a top thermoset laminate coverlay can be applied on top of the metal foil. Subsequently, an IR laser can be irradiated onto the thermal debonding sheet from underneath to precisely just the area of the debonding sheet below the circuitry pattern, thereby debonding a specific portion of thermal debonding sheet from the circuitry pattern of the metal foil. In some embodiments, the IR laser irradiates an area of the thermal debonding sheet that entirely or substantially corresponds to the area of the circuitry pattern.

In another embodiment, the thermoset laminate coverlay and IR laser may be replaced by a UV laminate and a UV laser.

Further downstream the reel-to-reel conveyor system, the thermal debonding sheet can be peeled away from the metal foil, effectively taking the negative material with it.

After the negative material is removed, the underside of the circuitry pattern may have debonding residue on it. There can be an optional CO2 laser scanner to clean any debonding residue on the underside of the circuitry pattern. The CO2 laser scanner can work in conjunction with an appropriate vision system such as a high-definition camera to detect and locate the presence of debonding residue.

In the situation where the fabrication process started out with a metal foil already on a plastic laminate, the laser ablation is contemplated to be done without carbonizing the bottom plastic laminate. In one embodiment, the plastic laminate is meant to stay adhered to the circuitry pattern as part of the intermediary product or the end product. Also, in some embodiments the negative material can stay adhered to the plastic laminate as part of the intermediary product or the end product. Because the circuitry pattern can be adequately and precisely ablated and electronically separated from the negative material, the remaining negative material is not expected to interfere with the normal operation of the end product.

In other embodiments which will be discussed in more details later, the negative material is to be removed from the circuitry pattern.

As such, another aspect combinable with the general implementation is a novel process of removing the negative material.

The contemplated novel method to remove the negative material, or slugs, can allow for faster processing of thicker metal foils during fabrication. It also eliminates the need for chemical etching.

An optional step includes using compressed air and air nozzles to blow the slugs off during certain point in the fabrication process, the detail of which will be discussed later.

In another further improvement on this process is to apply a top liner that is die cut and has a much stronger adhesive than the bottom liner adhered to the metal foil. The bottom liner can have an adhesive strength that is sufficiently strong enough so that it can remove the waste slugs with a higher yield, whether or not compressed air is applied to blow off the slugs. This process locates the cutouts over the waste regions.

In another aspect combinable with the general implementation, a novel sintering process to replace or supplement the dip or electroplating of pads is disclosed.

Typically a component is connected to a flexible printed circuit via the pads on a flexible printed circuit. Some metals, such as aluminum, however, cannot be easily soldered. While plated aluminum is currently available in the industry, plated aluminum is costly and cost-prohibitive. Therefore, the adaption of using aluminum as a metal foil in flexible printed circuits has been slow.

The herein disclosed novel sintering process can efficiently and cost-effectively prepare pads on various different types of metal foil on the fly. It should be noted that the sintering process can take place either before or after circuitry patterns have been formed. The process generally includes using a paste (e.g., tin paste, nickel paste) that has metal particle fillers. In one way, the paste can be silkscreened directly onto the intended spots of pads on the metal foil. In another way, the paste can be silkscreened first onto a sacrificial liner plastic followed by transferring the paste reel-to-reel onto the intended spots on the metal foil. An anvil and a press roller can be used to press the paste onto the metal foil. However the paste is placed onto the metal foil, a laser can be used to irradiate the paste and remove the non-metal portion of the paste while also sintering the metal particles onto the intended spot of the pads on the metal foil, effectively plating the pads.

In another aspect combinable with the general implementation, a novel lamination process reel-to-reel on the fly is disclosed.

As is well known in the industry, current FPC lamination process involves a two-step process in a sizeable vacuum oven. Here, the contemplated reel-to-reel lamination process can take place on the fly in the same reel-to-reel machine where other related processes are taking place. In one embodiment, the novel process can be performed without vacuum. In another embodiment, it can be performed within a vacuum enclosure on the fly. The enclosure can be disposed within the reel-to-reel machine and is part of the overall continuous reel-to-reel fabrication conveyor system.

Whenever a coverlay is placed on top of metal foil reel-to-reel, it can be laminated using the contemplated novel lamination process. One example has been briefly mentioned above where an overlay is placed onto of the metal foil before the negative material is removed.

The novel lamination process can include placing a UV coverlay on one side of the metal foil and subsequently passing the UV coverlay through a UV lamp within a vacuum enclosure to cure the adhesive.

In another contemplated example, the novel lamination process can include placing a thermo coverlay on a surface of the metal foil. The thermo coverlay layered on the surface of the metal foil can then passed through a heat roller. The heat from the heat roller reflows the thermoplastic and bonds to the metal foil. Alternatively or optionally, a laser light or other known heat lamps can be used to apply heat to the thermo coverlay. These curing processes can optionally be performed in a vacuum enclosure, which will be discussed in more details below.

In another aspect combinable with the general implementation, a novel laser welding process reel-to-reel to layer up flexible printed circuits to create a multi-layer flexible printed circuit is disclosed.

In prior art multi-layer flexible printed circuits, two or more metal layers can be joined together by creating a VIA. The contemplated welding methods offer an alternative method of joining layers of circuitry patterns.

In some embodiments, a fiber laser can be used to weld two metal foils together into a multi-layer format. Contemplated metal types can include, but not limited to, stainless steel, nickel, aluminum, and copper. In particular, a wobble conduction weld technique can be used.

In one example, a rotary die with protruding features that makes embossing features on metal foil 201 is provided to press specific spots of the two or more layers of metal foils together with sufficient pressure to deform the metal foils. It effectively makes adjacent layers of circuitry pattern physically touch or become closer to each other. Then fiber laser is irradiated to those specific spots to weld those spots together.

Optionally, before embossing the metal foils, a window can be created through whatever coverlay or substrate that may be in the way of laser welding so as to expose the intended locations for embossing and/or welding. This can improve the effectiveness of the embossing, thereby ensuring a successful welding process. Any known window-making processes can be implemented. Alternatively, a coverlay with pre-made windows are adhered to the metal foil, eliminated the extra step of creating windows.

In another contemplated example, an extremely thin layer of PSA (pressure sensitive adhesive) can be applied between the two layers of metal foil. The contemplated adhesive thickness is thinner than 10% of the thickness of the top metal foil. The laser can irradiate the intended weld spots to displace the adhesive locally and allow the two metal layers to weld together. In one contemplated example, several hundred watts CW fiber laser with galvanometer is implemented using a wobble weld technique.

While this specification contains many specific implementation details, these should not be construed as limitations on the scope of any inventions or of what may be claimed, but rather as descriptions of features specific to particular implementations of particular embodiments.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

It should be noted that the drawing figures may be in simplified form and might not be to precise scale. The thickness of certain sheet material in the drawing figures may be exaggerated for ease of illustration. In reference to the disclosure herein, for purposes of convenience and clarity only, directional terms such as top, bottom, left, right, up, down, over, above, below, beneath, rear, front, distal, and proximal are used with respect to the accompanying drawings. Such directional terms should not be construed to limit the scope of the embodiment in any manner.

Figure 1:
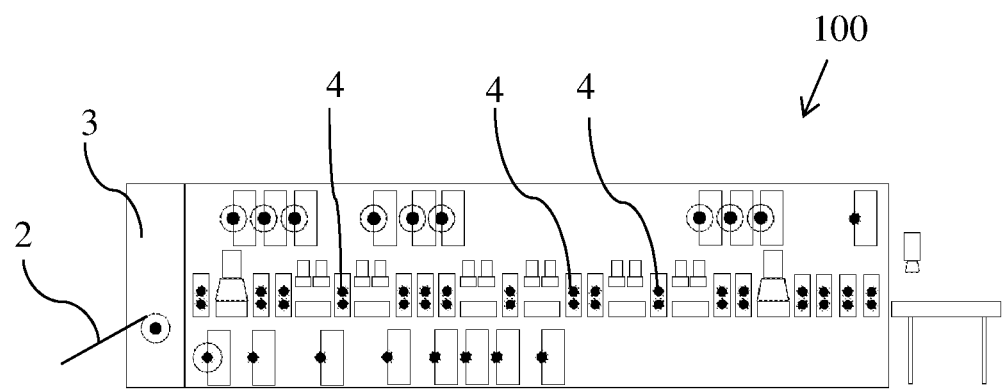
FIG. 1 illustrates one exemplar reel-to-reel machine workflow layout.

The following call-out list of elements in the drawing can be a useful guide when referencing the elements of the drawing figures:

1 Reel-to-Reel Machine
2 Beginning material
3 Feeder
4 Reel
5 Intermediary Product
6 Reel-to-Reel Machine
7 Reel-to-Reel Machine
8 Housing
9 End product
11 Driving Motor
15 Microprocessor
200 Laser Ablation Module
201 Metal Foil
202 First Surface
203 Second Surface
204 Sacrificial Liner
205 Laser Scanner
206 Plastic Laminate
207 Vacuum Enclosure for Ablation
208 Z Height Setter
221 Circuitry pattern
222 Outer Edge
223 Negative Material/Slug
225 Tie Bar
226 Residue
231 Patterning Step
232 Rough Ablating
233 Fine Ablating
234 Cutting a First Depth
235 Cutting a Second Depth
300 Slug-Removal Module
301 UV Laminate/Thermoset Laminate
302 UV or Thermoset Coverlay
303 Reel
305 Laser Scanner
306 Tracking Scanner
307 UV Laser Scanner
308 Vision System
309 Laser Scanner
310 Laser Scanner
311 High-Pressure Blower
312 Slug-Collecting Tray
313 Vision System
314 Sacrificial Liner
315 Vacuum Enclosure for Ablation
316 Plastic Coverlay
317 UV Laser Scanner
331 Visualizing and Tracking Step
332 Placing Coverlay on Top
333 Data received by microprocessor
334 Debonding Step
400 Sintering Module
401 Paste
402 Laser Scanner
404 Pad location
405 Vision System
406 Sacrificial Liner
408 Vision System
409 Sintered spots
410 Printer
500 Lamination Module
501 Nip Roller
502 Anvil
503 UV Lamp
508 Heated Nip Roller
509 Anvil
510 Vacuum Enclosure
512 Sealed entrance
513 Sealed Egress
515 Suction Nozzle
518 Suction Source
519 Heat Source
550 Laser Scanner
552 Vision System
600 Welding Module
601 First Metal Foil
602 Second Metal Foil
603 Top Dielectric Layer
604 Middle Dielectric Layer
605 Window
606 Molten metal
607 Hollow space
608 Sintered Paste
609 Weld Spot
609 Nip Roller
610 Debossing Die
611 Anvil
612 Deformation
620 Laser Scanner
641 Vision System
642 Laser Scanner
661 Rotary Die Cutter
662 Anvil
663 Sacrificial Liner
671 Rotary Die Cutter
672 Anvil
673 Sacrificial Liner
681 Reel
682 Reel
683 Reel
684 Reel 685 Reel
686 Reel
690 Z Height Setter
691 Z Height Scanner
700 Depaneling Module
701 Rotary Die Cutter
702 CO2 Laser Cutter

DETAILED DESCRIPTION OF THE EMBODIMENTS

The different aspects of the various embodiments can now be better understood by turning to the following detailed description of the embodiments, which are presented as illustrated examples of the embodiments as defined in the claims. It is expressly understood that the embodiments as defined by the claims may be broader than the illustrated embodiments described below.

The inventor has discovered a novel method of fabricating a flexible printed circuit (FPC) that either entirely or partially eliminates the use of a gantry. As will be described in more details below, some of the processes can optionally include the use of a gantry. Other embodiments may supplement any of the herein disclosed reel-to-reel fabrication processes with the use of a gantry at some point of the fabrication process. For the most part, many of the below disclosed embodiments relate to a novel reel-to-reel fabrication process of a flexible printed circuit (FPC). The end product may be a single-layer flexible printed circuit or a multi-layer flexible printed circuit.

In many of the embodiment to be discussed in detail, the novel reel-to-reel fabrication process relates to a process whereby one or more continuous sheet of material are fed into a reel-to-reel machine. In some embodiments, more than one reel-to-reel machine may be necessary to each separately fabricate a layer of flexible printed circuit, and then each individually produced layer of flexible printed circuit are combined using a yet another novel process to result in a multi-layer flexible printed circuit. To that end, this disclosure contains 1) a novel standalone reel-to-reel machine having various modules to produce a single-layer or a multi-layer flexible printed circuit, 2) a novel system of flexible printed circuit fabrication using multiple reel-to-reel machines to produce a multi-layer flexible printed circuit, and 3) individually novel processes/modules within a single reel-to-reel machine.

The concept of novel reel-to-reel fabrication in FPC manufacturing will be discussed first, followed by discussions on each of the individually novel processes/modules. It will, nevertheless, be understood that no limitation of the scope of the disclosure is thereby intended by the specific sequences these modules are presented below. For example, although the "laser ablation" process may be discussed prior to the "sintering process," the disclosure is not to be limited to having laser ablation occurring prior to sintering.

Also, it should be understood that in some embodiment, any one or more of the discussed processes/modules may be replaced with a suitable process known in the industry. In other words, in some embodiments, any of the contemplated modules below does not necessarily require that any other one or all of the contemplated modules to be necessarily present. For example, while the "laser ablation" process may be discussed in some embodiments as part of a series of other processes (e.g., lamination, sintering) to manufacture a certain intermediary product or end-product, the novelty of the lamination process shall not require the disclosed laser ablation process. The lamination process can stand on its own without requiring the laser ablation process. Also, any of these individual processes/modules may be replaced by a prior art method. For example, the herein disclosed novel sintering and lamination process can take place even if the circuitry pattern is formed by a typical chemical etching process. Yet in some other embodiments, any of the contemplated modules discussed herein does necessarily require that any other one or all of the contemplated modules to be necessarily present.

Therefore, certain features, processes, method steps, and modules that are described in this specification in the context of separate implementations of multiple processes/modules can also be implemented in a different arrangement and sequences of one or more processes/modules. Conversely, various features that are described in the context of a single implementation can also be implemented in multiple implementations separately or in any suitable subcombination.

Likewise, one or more features from a combination can in some cases be excised from the combination, and the claimed combination may be directed to a subcombination or variation of a subcombination As such, any alterations, permutations of process sequence, and further modifications of the described or illustrated embodiments and any further applications of the principles of the disclosure as illustrated therein are contemplated as would normally occur to one skilled in the art to which the disclosure relates.

As used herein, the term "continuous" in conjunction with a metal foil, coverlay, laminate material, substrate material refers to a state of feeding said sheet material into the reel-to-reel machine from one reel to another reel. In one embodiment, it can mean a very long roll of material that continues to feed into the machine such that when the leading end has exited the machine, the trailing end has yet to enter the machine. In another embodiment, it can mean a sheet material sufficient long enough for its leading end to make one turn at a reel while its trailing end is still passing over another reel. In yet another embodiment, it can mean a sheet material sufficiently long to have more than one intended flexible printed circuit arranged on the same sheet in a lengthwise, consecutive fashion.

Reel-to-Reel FPC Fabrication Device and Method

FIG. 1 generally depicts the basic architecture of one embodiment of a reel-to-reel machine 1, wherein a beginning material 2 is fed into the feeder 3. The feeder has the associated accessories such as motor and rotors to grab the beginning material 2 and feeding it into the reel-to-reel machine. As is known in typical reel-to-reel machines, there are various reels 4 disposed throughout the reel-to-reel machine 1, feeding, transporting, directing, pressing the various sheet materials.

Figure 2:
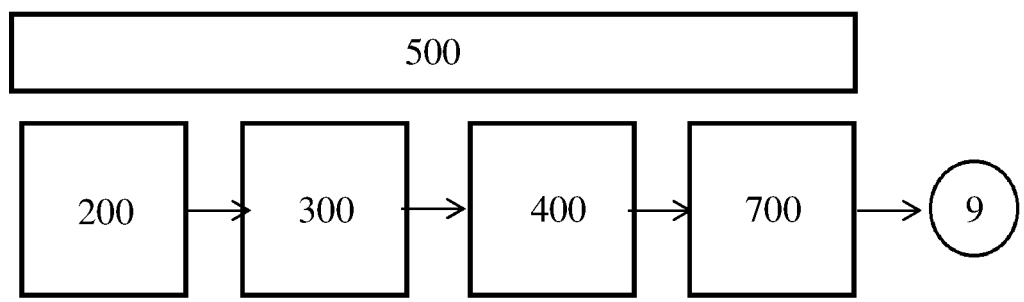
FIG. 2 illustrates another embodiment of workflow to produce an end product such as a multi-layer or a single layer flexible printed circuit.

The reel-to-reel machine 1 can have various components, or modules to perform various tasks in the reel-to-reel conveyor system. FIG. 2 provides a general overview of one contemplated workflow, according to one aspect of the reel-to-reel FPC fabrication method. Here, this particular workflow requires a laser ablation module 200, a slug-removal module 300, a sintering module 400, and at least one lamination module 500 dispersed within any of the other modules. A single-layer flexible printed circuit is produced (i.e., end product 9) after a depaneling module 700 which may include a rotary die cutter (not shown) or a CO2 laser cutter (not shown).

It should be noted that this is only one example of workflow having an exemplar sequence of modules. Many other and different sequences of modules are possible and one of ordinary skill in the art would immediately understand and recognize other possible ways to arrange these modules. For example, the ablation module 200 does not necessarily have to take place prior to the sintering module 400, and one skilled in the art would understand from this disclosure that slug-removal module 300 may have to take place after the laser ablation module 200.

Also, various components of the contemplated reel-to-reel machine 1 are herein artificially categorized into "modules." While certain component may be built into a unitary module, certain components may be dispersed throughout the overall reel-to-reel conveyor system. For example, there can be various places in the reel-to-reel conveyor system where lamination takes place. There can be one or more lamination steps in some of the above-mentioned modules. Therefore, as an example, lamination steps are not necessary performed only at a specific location by a specific modular unit of lamination machine. The same applies with other above-mentioned modules. For example, while one workflow diagram may show a single sintering module, some implementations may have the various required steps of sintering taking place at various locations upstream and downstream in the overall reel-to-reel conveyor system. For example, the first part and the second part of the sintering process may be separated by the laser ablation process. One of ordinary skill the art would immediately recognize from this disclosure that the disclosed components are versatile and can be re-arranged to suit specific design needs.

Figure 3:
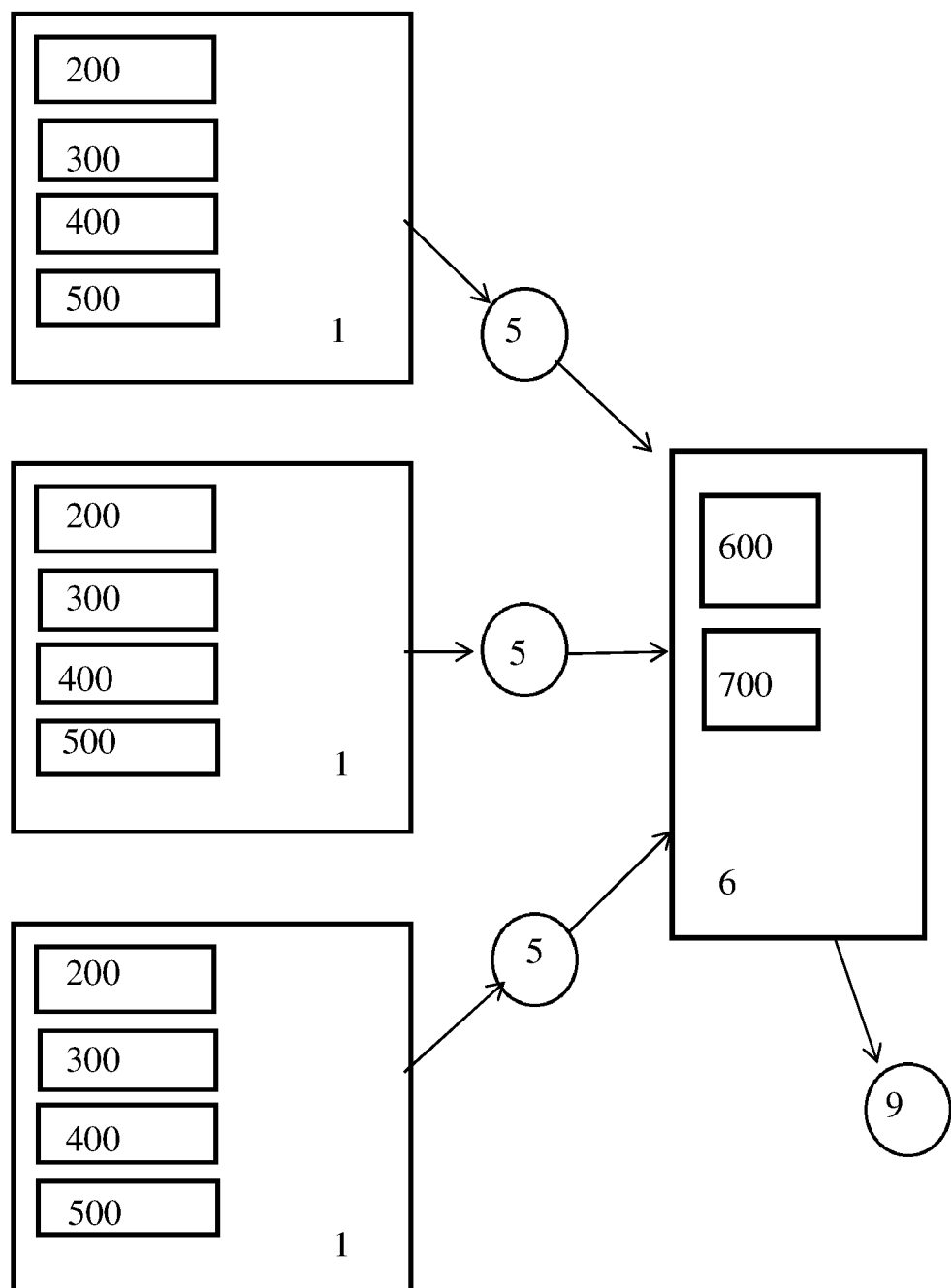
FIG. 3 illustrates another embodiment of workflow using three reel-to-reel machines each feeding an intermediary product, e.g., a single-layer flexible printed circuit, into a fourth reel-to-reel machine to produce an end product such as a multi-layer flexible printed circuit.

FIG. 3 provides another contemplated workflow, according to one aspect of the reel-to-reel FPC fabrication method. Here, this particular workflow requires four separate reel-to-reel machines. Three similar reel-to-reel machines 1 each has a laser ablation module 200, a slug-removal module 300, a sintering module 400, and a lamination module 500. These three reel-to-reel machines 1 each can produce a single-layer flexible printed circuit (i.e., an intermediary product 5), all of which can then be fed into a fourth reel-to-reel machine 6 to be combined into a multi-layer flexible printed circuit (i.e., end product 9). The fourth reel-to-reel machine 6 is unlike the other reel-to-reel machines in that its function is to receive intermediary products 5 for further processing into a multi-layer flexible circuit (i.e., the end product 9. In particular, the third reel-to-reel machine has a welding module 600 and a depaneling module 700.

Figure 4:
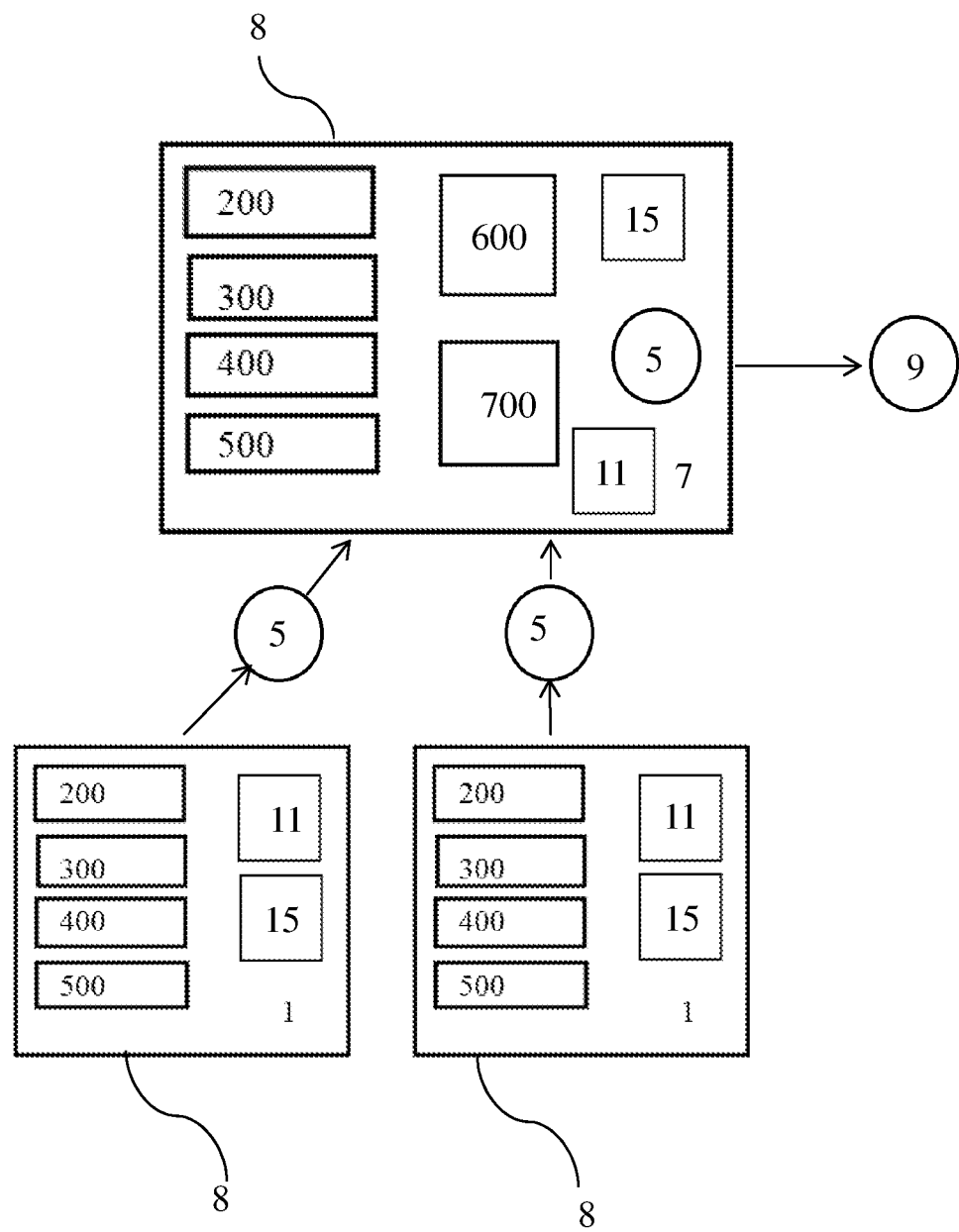
FIG. 4 illustrates another embodiment of workflow using two reel-to-reel machines each feeding an intermediary product, e.g., a single-layer flexible printed circuit, into a third reel-to-reel machine which while producing an intermediary product it also produces an end product such as a multi-layer flexible printed circuit.

FIG. 4 provides yet another contemplated workflow, according to one aspect of the reel-to-reel FPC fabrication method. Here, reel-to-reel machine 7 can have a laser ablation module 200, a slug-removal module 300, a sintering module 400, a lamination module 500, welding module, and depaneling module. Reel-to-reel machine 7 can make the intermediary product 5, and can combine it with intermediary products 5 received from reel-to-reel machines 1. Reel-to-reel machine then produces end product 9, which is a multi-layer flexible printed circuit.

Detailed parts disposed within any of these reel-to-reel machines 1, 6 and 7 will be discussed in the following sections. One of ordinary skill in the art would immediately recognize that the implementation of many of the herein disclosed embodiments may require basic known reel-to-reel equipment (e.g., housing, microprocessor, control panel, sensors, motors, reels and anvils, measurement and adjustment means). Description and discussion of these commonly known and necessary parts of a reel-to-reel operation are herein omitted because they are well within the ordinary skill of reel-to-reel technology. Also, some components or steps commonly known in prior art FPC fabrication are also herein omitted because they are well within the ordinary skill of FPC or PCB fabrication. For example, removing dust or preventing dusts from accumulating on the circuitry pattern.

In one embodiment, the contemplated reel-to-reel machine is capable of fabricating a printed flexible circuit on the fly. There can be a housing 8 (FIG. 4), a driving motor (FIG. 4), a nip roller 501 (FIG. 12), and an anvil 502 (FIG. 12) disposed within the housing. There can be a microprocessor 15 (FIG. 4) connected to the machine by wire or wirelessly. The microprocessor can be part of the machine or an add-on. There is a plurality of reels within the housing that defines a conveyor route for the passage of a metal foil reel-to-reel. Along the conveyor route other sheet materials can be introduced and added to the metal foil, as will be discussed in more details later.

Up and down stream of the conveyor route in a reel-to-reel direction, the conveyor route generally has a top side and a bottom side. The top side and the bottom side are parallel to each other and many of the components to be discussed below can be positioned on either side. It should be noted that while this disclosure may initially describe a component being on either a top side or a bottom side, one skilled in the reel-to-reel technology would understand that a reverse arrangement can be possible. In some embodiments, when two components are described as being on one particular side of the conveyor route, one skilled in the reel-to-reel technology would understand that the two components may also be arranged on opposite sides of each other in some scenarios depending on the design of the workflow.

Laser Ablation Device and Method

Contemplated method of creating a predetermined circuitry pattern on a metal foil 201 reel-to-reel can include feeding a continuous sheet of metal foil 201 into the reel-to-reel machine. Contemplated metal foil 201 includes at least one of aluminum, Ni-plated aluminum, Ni-plated copper, nickel, stainless steel, and copper.

Figure 5:
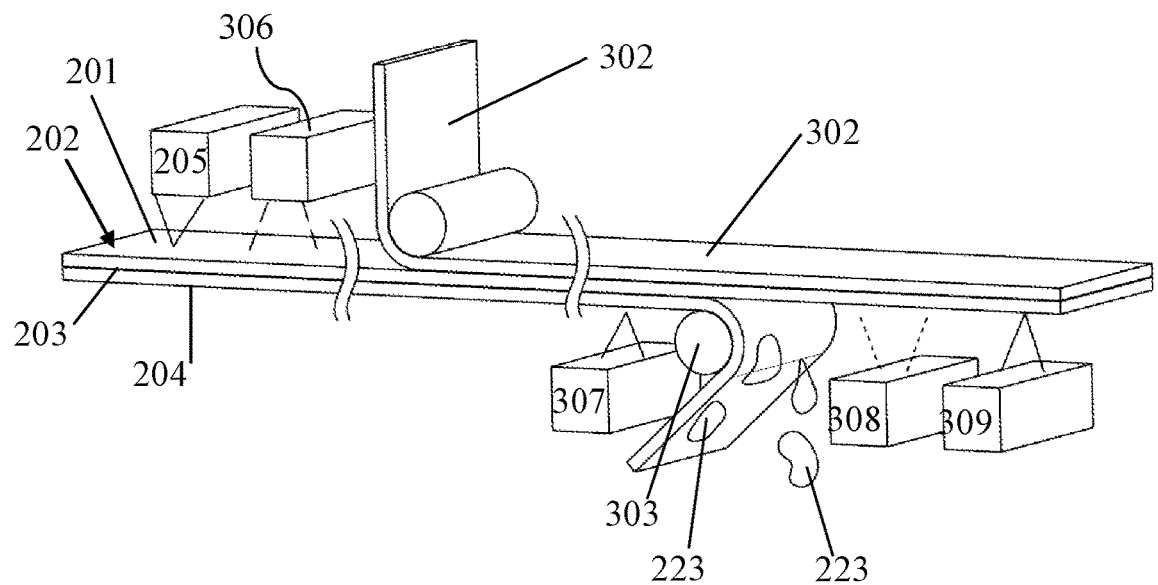
FIG. 5 is a simplified exemplar illustration of a laser ablation process and slug-removal process, according one aspect of the disclosure.
Figure 6:
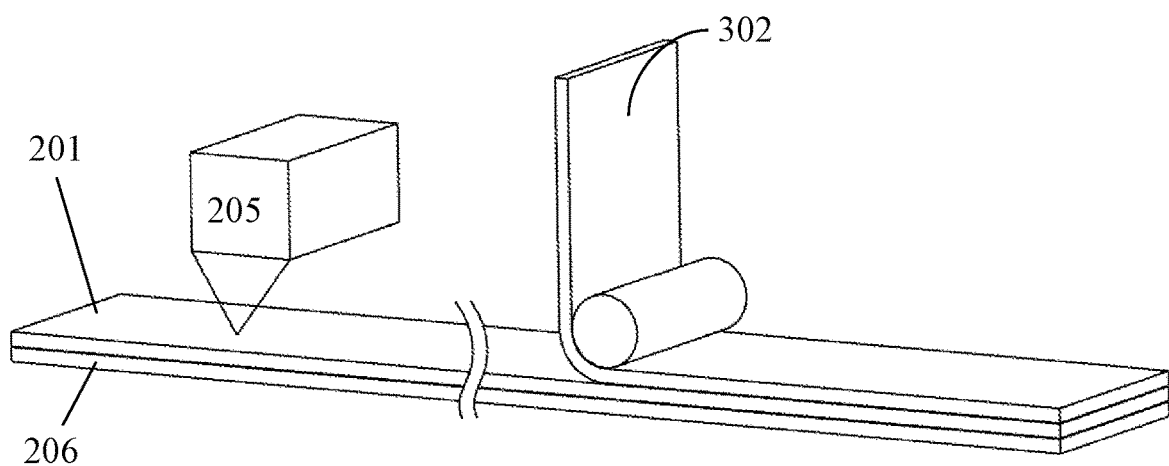
FIG. 6 is a simplified exemplar illustration of a laser ablation process directly on the metal foil without carbonizing the bottom plastic laminate, according one aspect of the disclosure.

As shown in FIGS. 5-6, the sheet of metal foil 201 has a top side 202 and the bottom side 203. In FIGS. 5-6, the sheet of metal foil 201 is on top of a layer of substrate. This substrate, as will be described below, can be a sacrificial liner 204 such a UV debonding sheet (FIG. 5) or a thermal debonding sheet (also FIG. 5). This substrate can also be a plastic laminate 206 (FIG. 6).

As used herein, the term "cut" or "cutting" in conjunction laser ablating the metal foil 201 refers to the commonly known photoablation process of removing certain portions of the metal foil 201 by irradiating it with a laser beam. It does not refer any mechanical removal process or chemical removal process.

Referring now to FIG. 5, there can be a sacrificial liner 204 attached to the bottom side 203 of the metal foil 201. This sacrificial liner 204 as illustrated in FIG. 5 can either be a UV debonding sheet or a thermal debonding sheet. Any other known sacrificial sheet material suitable for the purposes described below can also be used.

At the laser ablation module 200, starting with the combination of metal foil 201 and the sacrificial liner 204, there is a laser scanner 205 within the reel-to-reel machine 1 to perform patterning of the predetermined circuitry pattern 221.

The laser scanner 205 can use a fiber laser to ablate the edge 222 of a circuitry pattern 221 on the fly. Other types of laser are also contemplated, including a green laser, UV laser, and 1 um pico second and femto second lasers. In the example as shown in FIG. 6, a green laser can be used to ablate the edge 222 of the circuitry pattern 221 foil without damaging the plastic laminate 206 underneath the metal foil

201. Also, green laser has a high absorption for and can enable at least copper, aluminum, and nickel ablation. A high-power green laser is particularly contemplated to ablate most depths of the metal foil 201 first in one or more passes. Then a UV laser, a more precise green laser, a 1 um pico second, or a femto second lasers can be used to ablate the remaining thickness of the metal foil 201 without damaging the underlying plastic laminate 206.

Even in situations where a sacrificial liner 204 such as a thermal debonding sheet or a UV debonding sheet is used (as shown in FIGS. 5, 6), a more precise laser ablation as described above minimizes damage to the sacrificial liner 204. The sacrificial liner 204 that is minimally damaged may be recycled and reused, making it an environmentally and economically sound solution. In a preferred embodiment, the laser ablation is performed without ablating through the sacrificial liner 204. Additionally, a more precise laser ablation allows very accurate pattern ablation.

Alternatively, the laser scanner 205 can first rough-ablating through the entire thickness of the edge 222 using a green laser or 1 um fiber laser, following by a UV laser, or a more precise green laser, a 1 um pico second, or a femto second lasers. In operation, the laser scanner 205 irradiates a laser beam onto the top side 202 of the metal foil 201 along the outer edge 222 of the predetermined circuitry pattern 221 (see FIG. 9). One or more than one passes of the laser is contemplated to eventually and thoroughly cut through the thickness of the metal foil (cutting through the outer edge 222). In one embodiment, the metal foil 201 stops traveling through the reel-to-reel conveyor system during laser ablation. In another embodiment, the metal foil 201 continues to travel through the reel-to-reel conveyor system during laser ablation.

Figure 9:
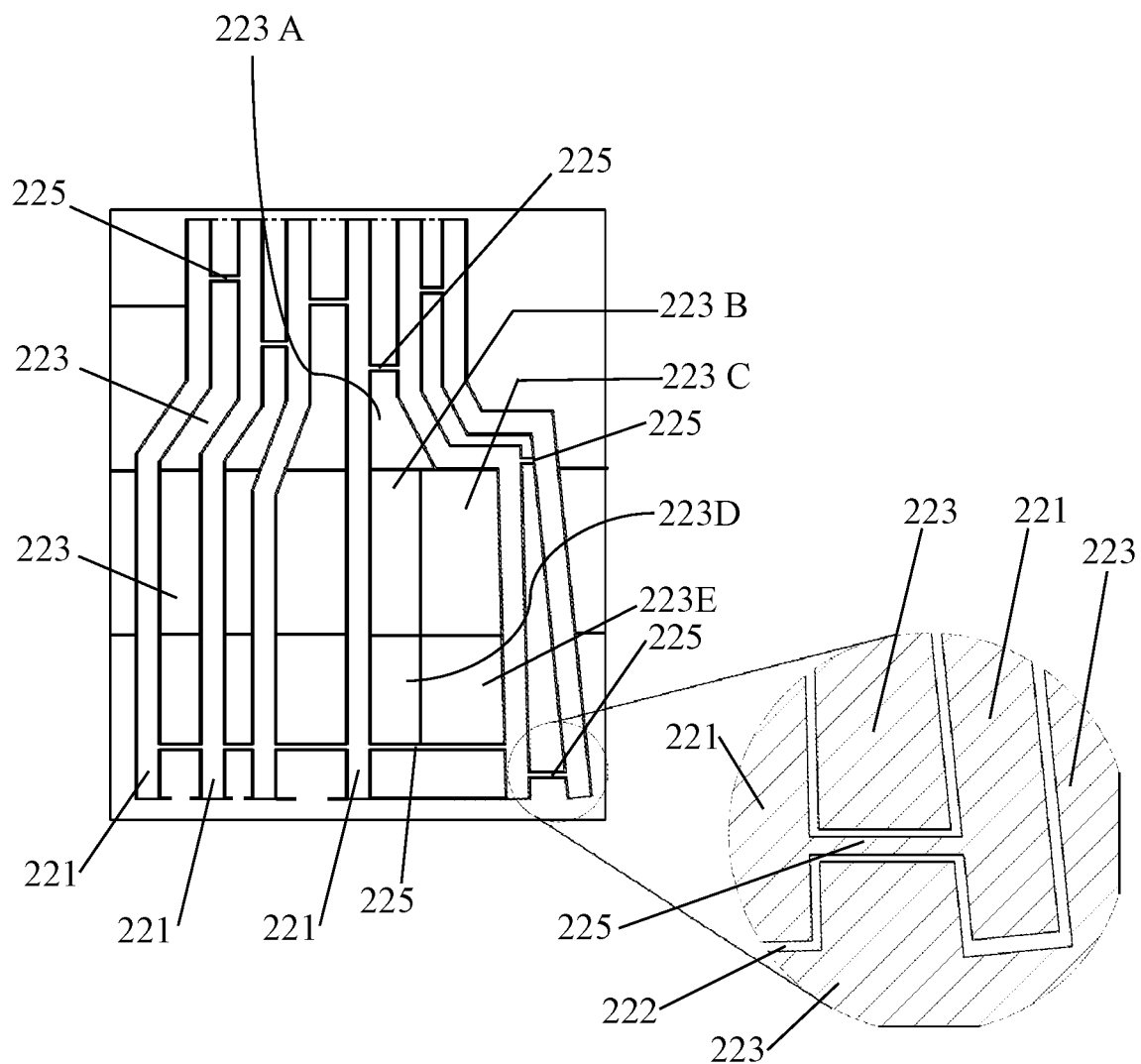
FIG. 9 shows a metal foil after laser ablation, where the outer edges of a circuitry pattern has been ablated, the negatives have been ablated into more manageable pieces, and tie bars have been created, according to one aspect of the disclosure.

In FIG. 9, the outer edge 222 of the circuitry pattern 221 has been cut entirely through, physically separating the circuitry pattern 221 from the negative material 223. As will be discussed in a later section, the negative material 223 can be subsequently removed in various novel methods. Here, one aspect of the inventive subject matter includes using the laser scanner 205 to ablate relatively larger or longer pieces of negative material 223 into smaller portions (as illustrated by dashed lines in FIG. 9). This can facilitate subsequent slug-removal steps.

During laser ablation, a portion of the ablated metal foil 201 is converted to plasma. There can be provided certain suction nozzles or exhaust mechanism to suck the plasma out of the reel-to-reel machine 1.

In some embodiments, the contemplated laser ablation module 200 can be enclosed in a vacuum enclosure 207 in part or in whole. The laser ablation module 200 is also contemplated to use a Z height setter 208 (FIG. 7) to assist in making proper alignment and adjustment. This can apply to any other laser scanner discussed in this disclosure. The Z height scanner can be located at the specific Z height for focus location of laser. The laser head or Z height scanner bed, however, could actively move if the Z height is variable or if even better tolerance can be achieved with a vision system.

The vacuum enclosure 207 and another other vacuum enclosure discussed in the disclosure can be a true vacuum condition where the enclosure is devoid of air. In other embodiments, this can be a near-vacuum condition where negative pressure is applied when necessary, but the force of the suction may not be enough to create a true vacuum condition. In yet other embodiments, such as what's shown in FIGS. 14 and 15, it can be an enclosure with movable and/or flexible body such that a source of suction 518 can assert sufficient negative pressure to cause the movable and/or flexible body to clamp, or squeeze, onto whatever material that is within the enclosure. If a clamping or flexible membrane is used to create even more suction then the surface energy of the membrane must be sufficiently low such that the sheet material can still pass through the clamping or flexible membrane.

In another aspect of the embodiments, the laser scanner 205 can purposely create tie bars 225 (see FIG. 9) all of which connect some or all parts of the circuitry pattern 221 with each other. Tie bars 225 can be created by intentionally leaving certain portions of the negative material as connecting bars 225 to connect all circuitry patterns 201 together as one single integral unit. Many such tie bars 225 can be created, connecting not only parts of a single circuitry pattern 201 to itself, but also physically connecting adjacent circuitry patterns 201 to one another. The laser scanner 205 can thin out the two terminal ends of each tie bar 225 thereby creating small neck regions. The small neck regions can allow easier subsequent removal of these tie bars 225. Again, the contemplated tie bars 225 can offer structural support to the circuitry pattern 221 as the circuitry pattern 221 goes further downstream into the reel-to-reel conveyor system. For example, tie bars 225 can be created for the workflow shown in FIG. 7, the detail of which will be discussed later. Because tension may cause the web of metal foil to wrinkle, one contemplated method to prevent wrinkling is to have tie bars oriented in the direction of travel and the direction perpendicular to it. Tie bars may also be in crisscrossed configuration, or a web configuration to counteract tension in multiple directions. Orienting only in the direction of travel would require a sufficiently wide enough tie bar to counter tension without wrinkling.

If the ablated circuitry pattern 221 were supported from its bottom side 203 with a plastic laminate 206 (as in FIG. 6), the circuitry pattern 221 may or may not need tie bars 225 as a structural support. The plastic laminate 206 can sufficiently keep the integrity of the circuitry pattern 221, unless the laser scanner 205 had defectively cut through the underlying plastic laminate 206 at some places.

Tie bars 225 can be subsequently removed at a later stage (to be discussed below in Slug-Removal Device and Method) via another laser scanner (310 in FIG. 7) downstream from here.

In some embodiments, a coverlay 302 can be placed onto top side 202 of the metal foil 201 subsequent to the laser ablation process (see FIGS. 5 and 6).

Slug-Removal Device and Method

As mentioned earlier, some embodiments of the disclosed FPC fabrication process require the removal of the slugs 223. The slug-removal device and method described herein is to take place subsequent to the laser ablation module 200. It may or may not come immediately after the laser ablation module 200. There may be intervening steps or modules taking place prior to slug removal. In some embodiments, the laser ablation that is to take place prior to slug-removal may be replaced by other means of creating a circuitry pattern, such as by traditional chemical etching. For example, an outline of the circuitry pattern may be first chemically etched away outside of the reel-to-reel machine, before the circuitry pattern is fed into the reel-to-reel machine for the herein discussed slug-removal process.

As used herein, the term "negative material" or "slug" in conjunction with removing the unwanted portion of the metal foil refers to portions of the metal foil 201 that are not intended to remain as part of the end product 9. If a slug is referred to as a loose slug in the specification, it does not specifically describe or limit itself to how loosely or not loosely such negative material is initially attached to the circuitry pattern 221 before removal.

As used herein, the noun "laminate" and "coverlay" in conjunction with a sheet material being adhered to the metal foil 201 are synonymous with each other in many of the embodiments mentioned herein. For example, a UV laminate 302 is sometimes referred to as a UV coverlay 302 in this disclosure. They both refer to the same thing. In some other embodiments, the coverlay can include other sheet material not traditionally considered to be a laminate sheet. Both "laminate" and "coverlay" refer to a two-part sheet form material comprised of a support film layer (e.g., polyimide) and a layer of adhesive (e.g., epoxy or acrylic based flexible adhesive, such as pressure sensitive adhesive, PSA), The thermoset materials and UV laminate can and do have an initial tact (like PSA) so it can be adhered to the metal foil prior to a thermal or UV lamination.

As used herein, the term "UV laminate" refers to a plastic laminate having a UV adhesive disperse on one side. The UV adhesive can be activated and cured by exposing it to UV radiation. A UV laminate can be created by taking a high viscosity gel UV adhesive and spread it over a plastic laminate like PET or PI (polyimide) using currently known processes (e.g., curtain coating, slot die coating).

Figure 7:
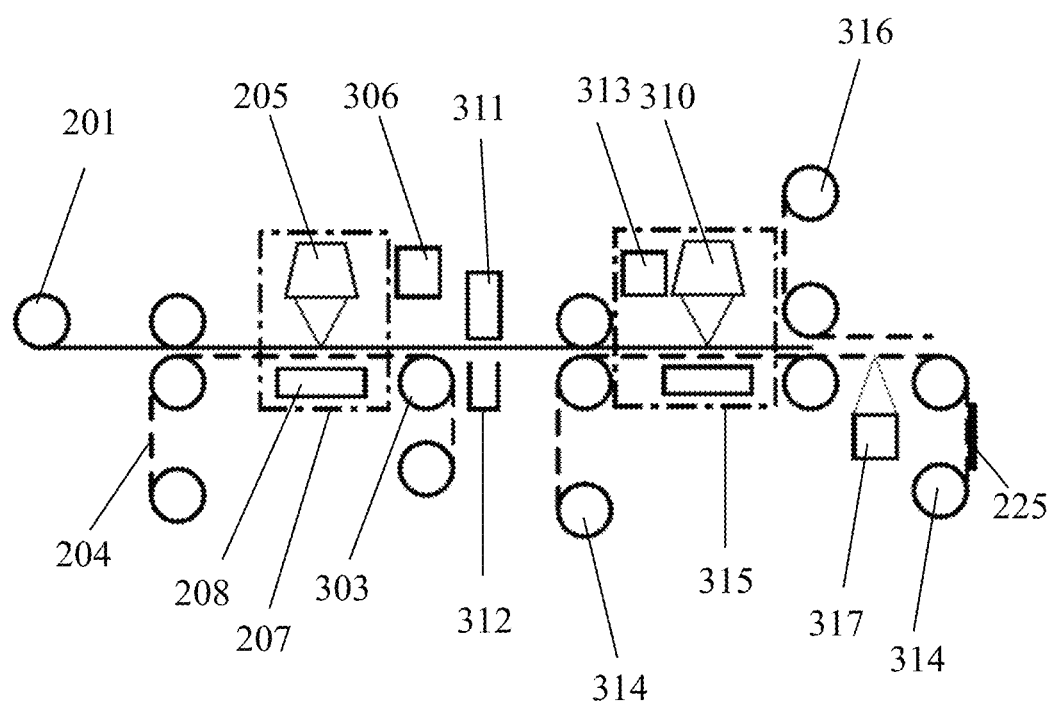
FIG. 7 is a simplified exemplar illustration of a workflow highlighting the laser ablation process and the slug-removal process, according one aspect of the disclosure.

Referring back to FIG. 5, a sacrificial liner 204 may be used to remove the slugs 223. Here, a UV debonding sheet 204 or a thermal debonding sheet 204 can be adhered to the bottom side 203 of the metal foil 201. This sacrificial liner 204 maybe pre-adhered to the metal foil 201 prior to feeding the metal foil 201 into the reel-to-reel machine 1, or it may be applied reel-to-reel onto the metal foil 201 within the reel-to-reel machine 1. FIG. 7 shows one such example.

In FIG. 5, at some point after the laser ablation process 200, a top UV laminate or thermoset laminate 302 coverlay can be applied on top of the ablated metal foil 201 reel-to-reel. This coverlay 302 can keep the structural integrity of the ablated circuitry pattern 221 intact during the subsequent slug-removal process. The timing and procedure to cure this top coverlay are discussed in the "lamination" section of this disclosure.

At some point downstream from where the top coverlay 302 was applied, a UV laser scanner 307 can be provided to irradiate from underneath the sacrificial liner 204. As shown in FIG. 5, UV laser scanner 307 selectively irradiates specific areas of the sacrificial liner where debonding from the metal foil 201 is desired. For example, it can irradiate all circuitry patterns 221 (not the edge 222) thereby making only the unwanted negative material 223 to remain bonded to the sacrificial liner 204. The support film layer of the UV debonding sheet is transparent to UV to ensure the UV radiation can reach the adhesive.

UV laser scanner 307 can use UV LED with optics to provide a concentrated beam of light. It could also be a solid state UV laser source. Another choice can be a high power UV laser light in the range of 400 nm to 450 nm. While UV spectrum is from 255 nm to 405 nm, application for the UV adhesives are between 365 nm and 420 nm.

The spot size of the laser beam for debonding can be adjusted to be larger to match the speed of the metal ablation laser. Other adjustment can also be made such as adding additional laser scanner to perform the debonding. The focus of the laser beam can be unfocused to control the power flux of the light. This is not a linear, but a sensor feedback with z height can allow for some control of this power flux.

In situations where a thermal debonding sheet 204 is used in place of UV debonding sheet 204, the process is similar. An IR laser scanner 307 can selectively apply heat to specific areas of the thermal debonding sheet where debonding from the metal foil 201 is desired.

Selective irradiation by the UV laser scanner 307 can be done precisely through the help of a tracking scanner 306. Tracking scanner 306 can be a vision system including a high-definition camera. It can include inline AOI (automated optical inspection) hardware. It can be disposed on the same side as the laser scanner 205 to visualize and track the ablated circuitry pattern 221 and provide necessary data to a microprocessor. The microprocessor can make calculations and send data signal to the UV laser scanner 307 with respect to exactly where to irradiate.

Besides selectively irradiating the negatives by a beam of UV laser or IR laser, one further contemplated method includes using a UV oven or a UV source/heat source that indiscriminately irradiate the entire surface of the debonding sheet, whether it's a UV debonding sheet or a thermoset debonding sheet. Prior to indiscriminately irradiate the entire surface of the UV debonding sheet, an opaque pattern correlating with the circuitry pattern 221 (or whatever areas that should not be debonded) can be laminated or printed on the surface of the UV debonding sheet. This opaque pattern allows irradiation to only selected areas that need to be debonded. In the case of a thermal debonding sheet, a pattern of heat reflective material can be printed or laminated on the surface of the thermal debonding sheet, thereby allowing heat to be applied only to selected areas that need to be debonded.

The sacrificial liner 204 is next peeled away from the circuitry pattern 221 when the sacrificial liner 204 changes direction of travel around reel 303. It should be noted that this peeling away process may take place immediately after, or much later after irradiation by the UV laser scanner 207 or IR laser scanner 307. In some instances, peeling away should take place much later so that sufficient time is given for debonding sheet deactivation. Negative material 223 remains adhered to the sacrificial liner 204 as the sacrificial liner moves downward away from the circuitry pattern 221.

Any debonding residue left remaining on the bottom side 203 of the circuitry pattern 221 can be detected by yet another vision system 308 using known image detection methods and provide feedback to the microprocessor. The microprocessor in turn sends command signals to yet another laser scanner 309 disposed on the underside of the circuitry pattern 221. The laser scanner then irradiates a laser beam to remove the debonding residue from the circuitry pattern 221.

In FIG. 7, the unablated metal foil 201 has a sacrificial liner 204 adhered reel-to-reel to its bottom surface 203. Next, the two-layer sheet material is transferred reel-to-reel into an optional vacuum enclosure 207 for laser ablation by laser scanner 205. Laser scanner 205 can be disposed on the topside of the metal foil 201.

The optional vacuum enclosure 207 can ensure an optimal adhesion between the two layers. As the laser scanner 205 ablates the edge 222 of the circuitry pattern 221, it can optionally create tie bars 225 as discussed above. In one particular embodiment, the ablation of the metal foil 201 by laser scanner 205 can result in a metal "web" having the circuitry pattern 221, the tie bars 225, and a perimeter to keep the web structurally sound. At some point downstream the reel-to-reel workflow, the perimeter can be removed from the circuitry pattern using any of the herein disclosed slug-removal methods. For example, the perimeter can be moved at the very end of the reel-to-reel workflow when the intermediate product 5 or the end product 9 is being depaneled. The perimeter can have various sizes and shapes to provide the needed structural support. In one embodiment, the perimeter maintains the outer edges of the original metal foil 201 such that the web would be a continuous web sheet have a straight leading edge and two parallel straight side edges. In another embodiment, the perimeter can be wider than a width of a single circuitry pattern 221. In yet another embodiment, the perimeter is similar to the picture frame. In still yet another embodiment, the perimeter can be two parallel bands along the left and right side of the metal foil 201.

The laser scanner 205 ablates through the depth of the edges 222. In one embodiment, the laser scanner 205 does not ablate into the optional sacrificial liner 204. If the laser scanner 205 does not ablate through the sacrificial liner 204, the sacrificial liner 204 can be used together with a UV laser scanner 307 (as in FIG. 5) to remove the slugs 223 as described previously. Take FIG. 7 as an example, one may insert a UV laser scanner 307 (of FIG. 5) downstream from laser scanner 205 and upstream from the first labeled reel 303. This would allow debonding and peeling off of the slugs 223, followed by a high pressure blower 311 to blow off any remaining slugs 223.

FIG. 7, however, illustrates a less-preferred embodiment where there is no UV laser scanner 307 to debond sacrificial liner 204 immediately downstream from laser scanner 205. Here, the laser scanner 205 can thoroughly ablate through edge 202 and does not ablate the sacrificial liner 204. After the sacrificial liner is peeled off via reel 303, a high pressure blower 311 can indiscriminately blow a high-pressure stream of air onto the top of the web of metal foil 201, which includes the perimeter, the circuitry pattern 221, tie bars 225, and slugs 223. This stream of air can blow off slugs 223 that were physically separated from the circuitry pattern 221 during the laser ablation process 200. A slug-collecting tray 312 can be provided underneath to catch any falling slugs 223. After this process, what's left on the conveyor system reel-to-reel is a connected web of circuitry patterns 221, perimeter, and tie bars 225.

Further downstream from here is an optional vision system 313 to visualize the ablated circuitry pattern 221 and associated tie bars 225 (and any external tension frames). There can be another optional sacrificial liner 314 applied reel-to-reel to the bottom surface 203 of the circuitry pattern 221. At some point downstream this connected web of circuitry patterns 221 is transferred into another laser ablation module where a laser scanner 310 is to separate the tie bars 225 (and any external tension frames) from the circuitry pattern 221. The vision system 313 provides data to the microprocessor which in turn sends signal to the laser scanner 310 on exactly where to make the necessary ablation. This ablation module can optionally be enclosed in a vacuum enclosure 315. The vacuum enclosure 315 can enhance adhesive between the layers and ensure that the separated tie bars 225 (and any external tension frames) are adequately adhered to the sacrificial liner 314.

Next, a plastic coverlay 316 can be applied to the top side of the two-layer sheet (circuitry pattern 221 and sacrificial liner 314) to provide structural support to the circuitry pattern 221 which is especially necessary when the tie bars 225 (and any external tension frames) is to be removed next. It should be noted that the plastic coverlay 316 may instead be applied to the top side of the metal foil 201 prior to the laser scanner 310 removing the tie bars 225.

Subsequently, a UV laser scanner 317 receives a command signal (based on data collected by the vision system 313) from the microprocessor to selectively irradiate an area of the sacrificial liner 314 that resembles the circuitry pattern 221. In this way, the tie bars 225 (and any external tension frames) remain adhered to the sacrificial liner 314 while the circuitry pattern 221 is debonded from the sacrificial liner 314.

As the sacrificial liner 314 peels away from the moving direction of the circuitry pattern 221, tie bars 225 (and any external tension frames) are effectively removed from the circuitry pattern 221. Because this sacrificial liner 314 is optional, if the sacrificial liner is not used here, the tie bars 225 can just drop off from the circuitry pattern 221.

There can be an optional vision system (not shown) and laser scanner (not shown) similar to 308 and 309 of FIG. 5 to detect and remove any debonding residual from the bottom surface 203 of the circuitry pattern 221.

Another improvement contemplated for any of the above slug-removal processes is to ablate any slug 223 into smaller and/or shorter pieces before removal. In FIG. 9, long pieces of slugs 223 can be ablated by a laser scanner into shorter pieces, and there is shown on a relatively larger piece of slug 223 that is ablated into five manageable pieces (223A, 223B, 223C, 223D, 223E).

Figure 8:
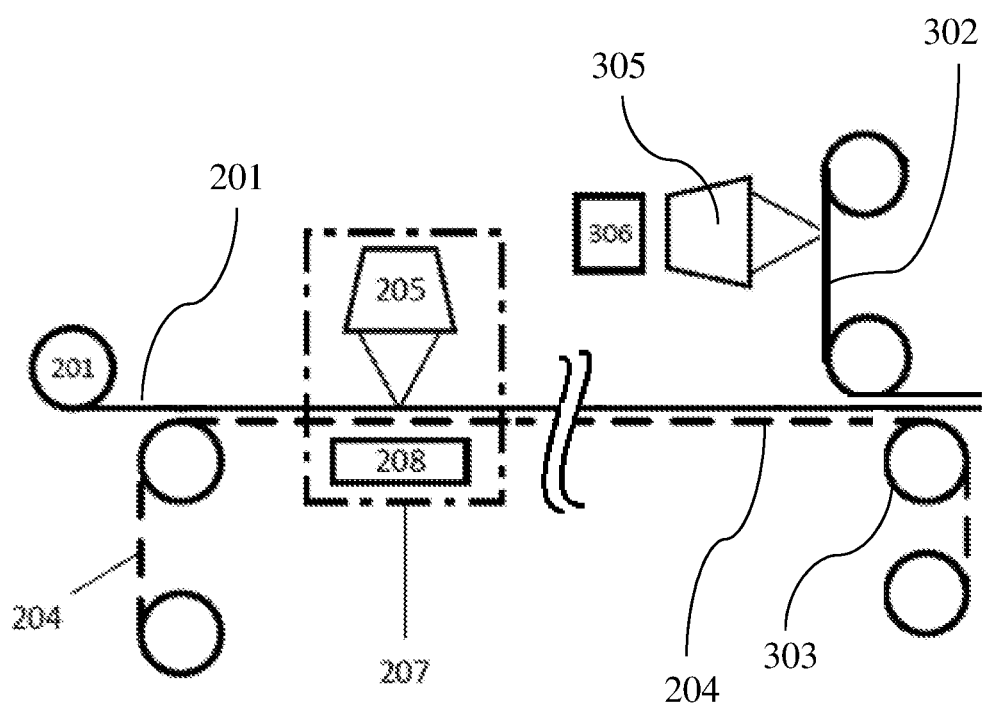
FIG. 8 is a simplified exemplar illustration of a workflow highlighting a laser ablation process using a sacrificial liner on the bottom and a coverlay on top, wherein the coverlay has selected areas of its adhesive layer removed by a laser prior to applying the coverlay onto the metal foil, according one aspect of the disclosure.

FIG. 8 illustrates one embodiment where a top coverlay 302 can be first ablated by laser scanner 305 to selective remove certain portion of its adhesive layer. Here, metal foil 201 first has a sacrificial liner 204 applied to its underside. Then, the metal foil 201 undergoes ablation by laser scanner 205 to create a circuitry pattern 221. Downstream from here, a vision system 306 can collect visual data of the circuitry pattern 201 and allows a downstream laser scanner 305 to ablate the adhesive layer 302 so that the ablated pattern may match up with the circuitry pattern 221 on metal foil 201. Adhesive layer 302 may be ablated without damaging the support film layer of the coverlay. In other words, only the adhesive layer is removed, and only an area that entirely or substantially corresponds to the negative material 223 of the metal foil 201 is removed.

The coverlay 302 is then applied unto the top surface 202 of the metal foil 201. Unablated portion of the adhesive layer on the underside of the coverlay 203 is contemplated to correspond entirely or substantially to the circuitry pattern 221. When sacrificial liner 204 is peeled away via reel 303, it would attempt to take the circuitry pattern 221 and the slugs 223 with it. However, because the adhesive layer on the underside of the coverlay 203 is contemplated to have stronger peel strength than the adhesive of the sacrificial liner 204, only the slugs 223 would be removed. Note that in this example, the sacrificial liner 204 did not require a debonding process. In other embodiments, an optional debonding process can be added.

Laser Sintering Device and Method

The following description refers to a novel method of plating designated pads on an unablated metal foil 201, or on a circuitry pattern 221. The designated pads can be a thru-hole pad or a surface mount pad. The metal foil 201 can be made of aluminum, tin, nickel, and copper.

Figure 10:
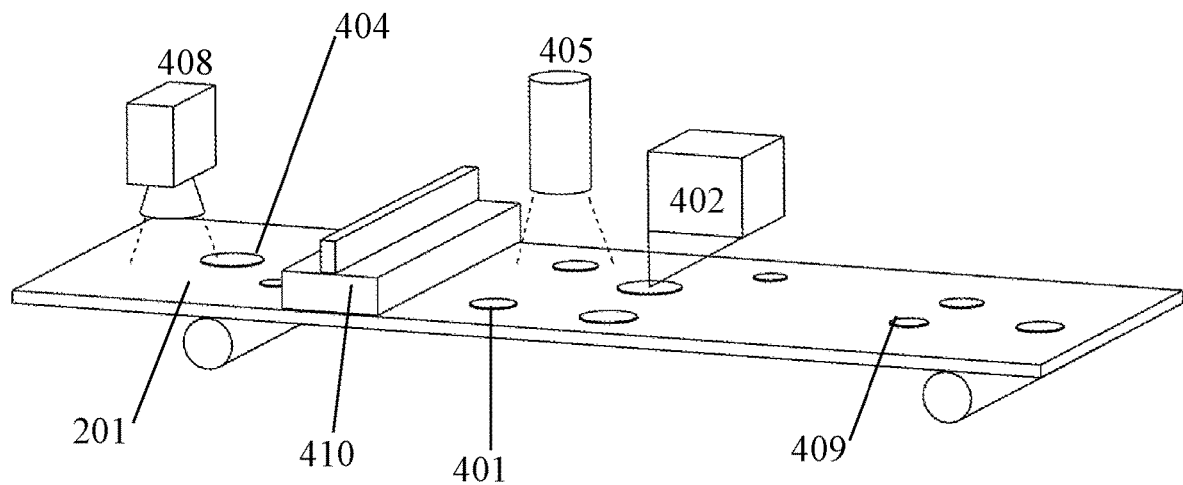
FIG. 10 is a simplified exemplar illustration of a workflow highlighting the placement of sintering paste by a printer followed by a laser sintering process, according one aspect of the disclosure.
Figure 11:
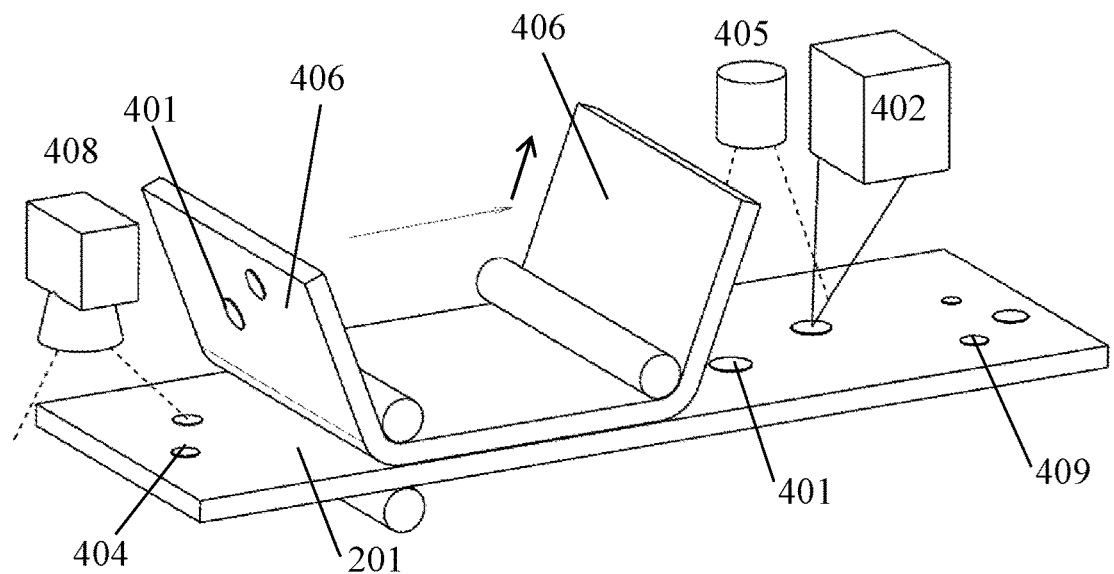
FIG. 11 is a simplified exemplar illustration of a workflow highlighting the placement of sintering paste by a sacrificial liner followed by a laser sintering process, according one aspect of the disclosure.

Referring now to FIGS. 10 and 11, where a metal foil 201 is being transferred reel-to-reel within the reel-to-reel machine 1. The novel sintering device and method involve placing a paste 401 onto designated spots of the pad locations 404 on the metal foil 201, followed by irradiating the paste 401. The paste 401 can include metal particle filler in it. When the paste 401 is irradiated by a laser scanner 402, the non-metal component of the paste is removed while the metal particle filler is sintered onto the pad locations 404.

In FIG. 10, the paste 401 can be directly printed onto the pad locations 404 via a depositor disposed within the housing on either the top side or the bottom side of the conveyor route. This contemplated depositor is capable of depositing a sintering paste 401 on the fly onto the metal foil 201. In one embodiment, the depositor is a printer 410 having a print head. Printer 410 can be a laser printer type or an inkjet printer type of technology. Printer 410 can also be a silkscreen printer. If the circuitry pattern 221 has been created prior to the sintering module 400, then a vision system 408, which may include a high-definition camera or other relevant sensors, can be provided to visualize the relative locations of the pad locations 404. This data is collected and processed by a microprocessor, which in turn send a command signal to the printer 410. The command signal directs the printer 410 to place the paste 401 onto the actual pad locations 404. The microprocessor can also send a command signal to a downstream laser scanner 402, directing it to irradiate the actual pad locations 404 which now have paste 401 on them. Laser scanner 402 may implement a fiber laser. As mentioned before, non-metal portion of the paste 401 are then removed by the laser, and the metal fillers of the paste 401 are directly sintered onto the pad locations 404.

In another embodiment, the metal foil 201 can be unablated prior to the sintering module 200. That is, an unablated sheet of metal foil 201 can be sintered first in designated pad locations 404, and subsequently use laser scanner 205 to ablate a circuitry pattern 221 using the sintered spots 409 as reference points. In this case, vision system 408 would be optional, and there would be vision system 405 downstream from the printer 410 to detect actual locations of the paste 401. This data is then provided to a microprocessor which in turn sends a command signal to the laser scanner 402. The command signal directs the laser scanner 402 to irradiate the exact locations of these paste 401. The microprocessor may also send command signals to relevant components of the laser ablation module 200, such as the laser scanner 205 in FIG. 5 so that subsequently the laser scanner 205 would ablate a desired circuitry pattern 221 using the actual sintered spots 409 as reference points.

One of ordinary skill in the art would immediately recognize that a vision system such as those describe herein (405, 408) can be an important tool in various locations throughout the reel-to-reel machine 1. It can be provided before and/or after a specific task to ensure and assist in calibration and alignment. Therefore, there are specifically contemplated other vision systems throughout the reel-to-reel machine 1 and in each of the working modules to perform these functions, even though they are not specifically described.

In FIG. 11, the paste 401 can be transferred onto the pad locations 404 via a sacrificial liner 406. The sacrificial liner 406 is first prepared by silk-screening the paste 401 onto the sacrificial liner 406 in corresponding spots. Sacrificial liner 406 has a lower surface energy, thereby allowing the paste 401 to stay on the top surface 202 of the metal foil 201, which has higher surface energy.

The metal foil 201 with paste 401 on it now passes under a vision system 405 which may include a high-definition camera and/or other visualization sensors. Vision system 405 detects the locations of each paste 401 relative to a reference point. This data is then provided to a microprocessor which in turn sends a command signal to the laser scanner 402. The command signal directs the laser scanner 402 to irradiate the exact locations of these paste 401. In one embodiment, the sinter module 400 can be downstream of the laser ablation module 200. This means the circuitry pattern 221 can be created prior to any sintering taking place. A vision system 408 which may include a high-definition camera and/or other visualization sensors may be provided to visualize the circuitry pattern 221 prior to transferring the paste 401 onto the metal foil 201. The vision system 408 can visualize and determine the relative locations of pads 404, relative to a reference point. This data is then collected and processed by a microprocessor, which then send command signals to relevant components of the sintering module 400 to make alignment correction/calibration on the fly. This would ensure the sacrificial liner 406 is accurately aligned with the circuitry pattern 221, allowing the paste 401 to accurately attach to pad locations 404.

In another embodiment, the sintering module 400 can be upstream of the laser ablation module 200. This means the circuitry pattern 221 can be created by laser ablation after sintering has taken place. Or alternatively, laser scanner 205 that does the laser ablation can also concurrently irradiate the sintering paste 401. Sintering paste 401 silkscreened onto designated spots of the sacrificial liner 406 can be first transferred to an ablated sheet of metal foil 201. A vision system 405 which may include a high-definition camera and/or other visualization sensors may be provided to visualize the relative locations of the paste 401 on the ablated sheet of metal foil 201. This data is then collected and processed by a microprocessor, which then send command signals to relevant components of the laser ablation module 200, such as the laser scanner 205 in FIG. 5 so that subsequently the laser scanner 205 would ablate a desired circuitry pattern 221 using the actual sintered spots 409 as reference points.

In some embodiments, any of the first metal foil 601, second metal foil 602, top dielectric layer 603, and dielectric layer 604 can be laminated together using any of the herein disclosed lamination method and components. The lamination can occur prior to or after the laser sintering step.

Reel-to-Reel Lamination Device and Method

The novel lamination method relates a process of applying a sheet material onto 1) an ablated metal foil 201 having the circuitry pattern 221 and the negative material 223, 2) an unablated metal foil 201, 3) a circuitry pattern 221 with negative material 223 already removed, and/or 4) any other material being passed through the reel-to-reel conveyor system.

The sheet material can be a 1) UV coverlay 302 (see FIGS. 5, 6, 7, 12, 14, and 16), 2) a thermoset coverlay 302 (see FIGS. 5, 6, 7, 13, 15, and 17), and/or 4) a plastic laminate 316 as illustrated in FIG. 7. One of ordinary skill in the art would recognize that other appropriate laminates may also be used using the herein described methods and device on the fly. In some instances, all or some components/steps of the herein disclosed lamination method can be used to apply a sacrificial liner to the metal foil 201, such as the sacrificial liner 204 disclosed when discussing FIGS. 5 and 7.

Although in some places within this disclosure the lamination process may be described as a lamination module 500, it should be noted that the word "module" does not limit the related required lamination components to take place within a single modular unit. The related required lamination components to laminate one sheet material may be dispersed at more than one locale within the reel-to-reel conveyor system. In other words, there may be intervening processes taking place within the lamination process. For example, in FIG. 12, downstream from the nip roller 501 but upstream from the UV lamp 503, sintering or laser ablation may take place. Also, while some workflow diagrams disclosed herein may indicate only one lamination module 500 in a reel-to-reel machine 1, it does not limited lamination to only one instance of lamination.

In most embodiments, lamination can take place as part of the herein disclosed sintering process, laser ablation process, slug-removal process, and welding process.

Figure 12:
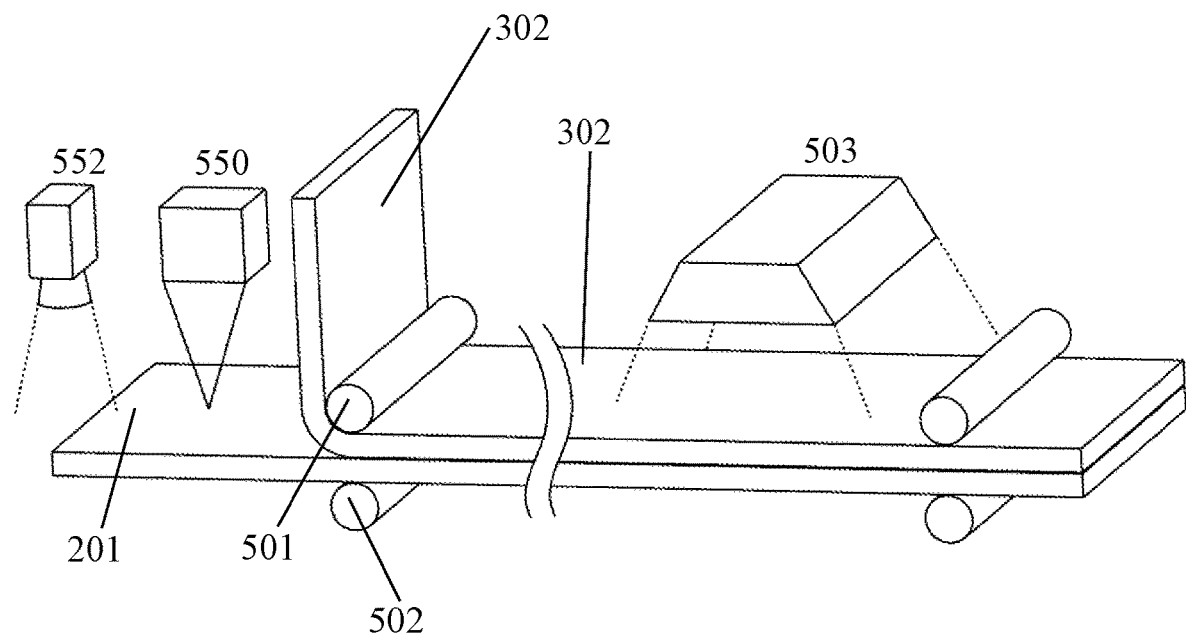
FIG. 12 is a simplified exemplar illustration of a workflow highlighting the placement of a UV coverlay followed by exposure to a UV source, according one aspect of the disclosure.

Referring now to FIG. 12, a UV coverlay 302 is applied to the metal foil 201 via nip roller 501 and anvil 502. What's shown in FIG. 12 may be a detail drawing of any of the disclosed drawing figures where a UV coverlay 302 is shown/discussed. Here, the UV coverlay 302 is subsequently passed under a UV lamp 503 to cure the adhesives thereby adhering the UV coverlay 302 to the metal foil 201.

There can be an optional laser scanner 550 somewhere upstream before the UV coverlay 302 is placed on top of the metal foil 201. Laser scanner 550 irradiates a laser beam over the top surface 202 of the metal foil 201, creating tiny peaks and valleys thereby increasing the surface energy of top surface 202. This can improve adhesion when the UV coverlay 302 is subsequently laminated to the metal foil 201.

In one embodiment, the laser scanner 550 can indiscriminately irradiate the entire top surface of the metal foil 201. In another embodiment, the laser scanner selectively irradiates just the circuitry pattern 221 (whether the circuitry pattern 221 has been ablated or has yet to be ablated). There can be a vision system 552 to visualize the top surface 202 of the metal foil 201, providing data to a microprocessor which in turn signals the laser scanner 550 as to exactly where to irradiate.

Although laser scanner 550 is given a designated part number in the figures, laser scanner 550 can be any one of the previous described laser scanners, if it is physically located upstream from the nip roller 501. For example, if the lamination process shown in FIG. 12 is a detailed illustration of what's shown in FIG. 5, then laser scanner 205 of FIG. 5 can be the laser scanner 550 of FIG. 12. Similarly, the vision system 306 of FIG. 5 can also function as the vision system 552 of FIG. 12.

Figure 13:
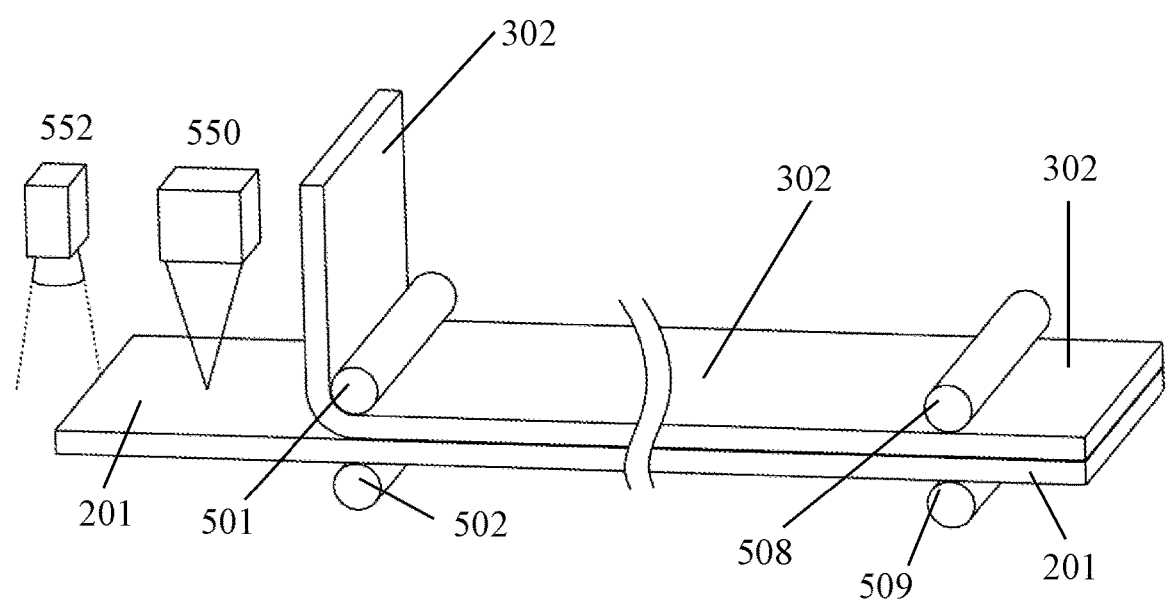
FIG. 13 is a simplified exemplar illustration of a workflow highlighting the placement of a thermoset coverlay followed by exposure to a heat roller, according one aspect of the disclosure.

Referring now to FIG. 13, where a thermoset coverlay 302 is applied to the metal foil 201. Here, somewhere downstream from nip roller 501 and anvil 502 can be a heated nip roller 508 and anvil 509. Heated nip roller applies heat and pressure to the thermoset coverlay 302, thereby adhering it to the metal foil 201. Similar to FIG. 12, there can be an optional laser scanner 550 and an optional vision system 552 to perform similar functions as in FIG. 12. Also, laser scanner 550 and vision system 552 can be any of the upstream laser scanners and vision systems, as previously discussed.

Referring back to FIG. 7, the herein disclosed lamination process can be utilized in at least two places in this figure. Firstly, coverlay 302 can be laminated onto the metal foil 201 using any of the herein disclosed methods. FIG. 7, however, can be a simplified illustration thus does not show certain details (e.g., a UV lamp or a heated nip roller to cure the coverlay are not shown). Secondly, plastic coverlay 316 can be laminated onto the metal foil 201 using any of the herein disclosed methods.

Figure 14:
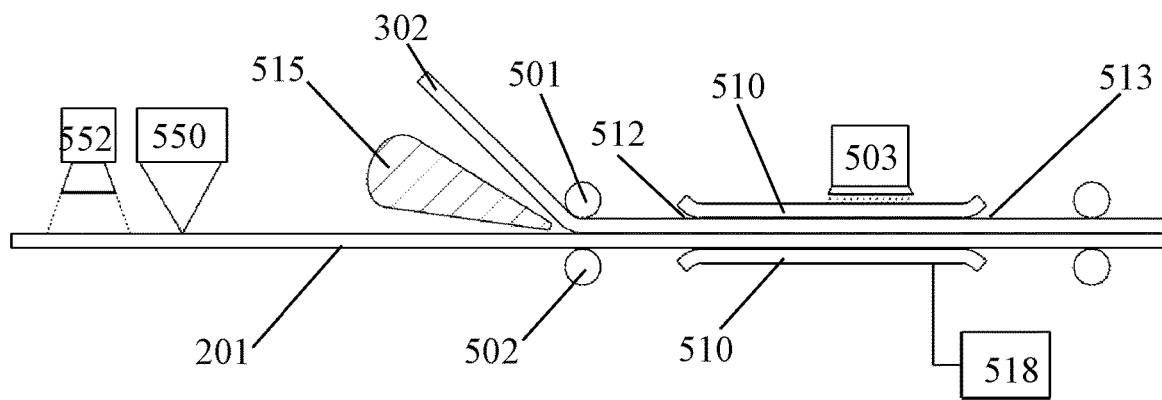
FIG. 14 is a simplified exemplar illustration of a workflow highlighting a lamination process using a vacuum source, followed by exposure to a UV source, according one aspect of the disclosure.

In FIG. 14, further improvements to the lamination process are provided. Here, an air suction nozzle 515 can be provided to minimize retention of air bubbles between the UV coverlay 302 and the metal foil 201. Suction nozzle 515 can point directly at the juncture where the UV coverlay 302 initially meets the metal foil 201. Suction nozzle 515 can have a linear air intake that corresponds to the widths of the metal foil 201. It can have a rather flat configuration like a duck bill to extend into the juncture. The coverlay-metal foil bi-layer is then passed through a sealed entrance 512 to a vacuum enclosure 510. Vacuum enclosure 510 may or may not provide a perfect or near-vacuum condition. Vacuum enclosure 510 can provide a negative pressure to whatever multi-layer sheet material that is passed therethrough to drive as much air bubbles out in between the layers as possible. In this particular embodiment, the vacuum enclosure has a very small volume and can be comprised of a flat bladder made of two slippery rubber sheets. The flat bladder can have a flexible body and can be connected to a suction source 518, which creates a vacuum or near vacuum condition within the flat bladder. As shown in FIG. 14, the flexible body of the flat bladder sandwiches the bi-layer and leaves very little volume of empty space. Suction provided by the suction source 518 essentially squeezes the two slippery rubbery sheets (i.e., flexible body) onto the coverlay-metal foil bi-layer. This action can remove air bubbles from in between the UV coverlay 301 and the metal foil 201.

The flat bladder can have a transparent skin such that a UV lamp 503 can irradiate through and cure the UV coverlay 302. Alternatively, the UV lamp 503 can be located downstream from the flat bladder to irradiate and cure the UV coverlay 302.

As discussed previously, optional laser scanner 550 can be provided to increase surface energy of the top surface 202 of the metal foil 201. Similarly, there can be an optional vision system 552 to collect data.

Figure 15:
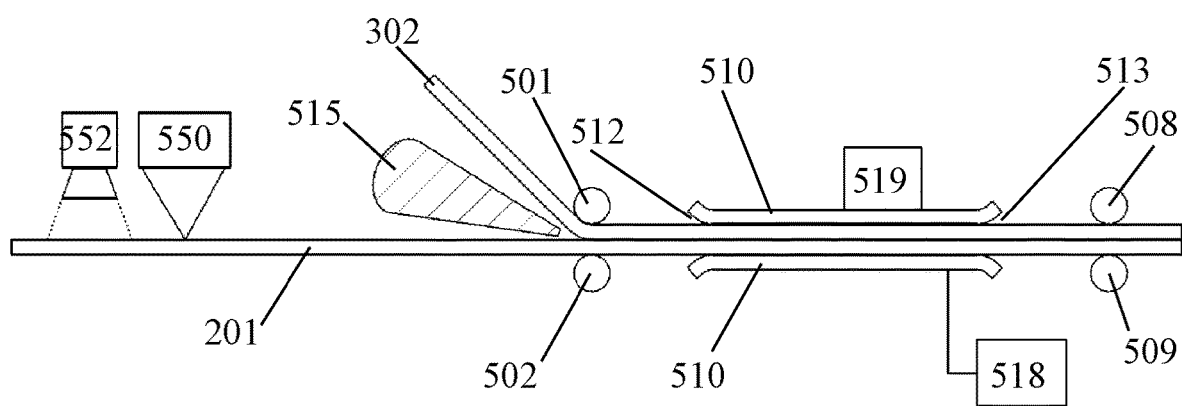
FIG. 15 is a simplified exemplar illustration of a workflow highlighting a lamination process using a vacuum source, followed by exposure to a heat source, according one aspect of the disclosure.

FIG. 15 illustrates a similar set up except the coverlay 302 is a thermoset coverlay. Here, instead of a UV lamp, a heated nip roller 508 and anvil 509 is used downstream from the vacuum enclosure 510. Alternative to having a heated nip roller 508 and anvil 509, the thermoset coverlay 302 can be cured by a heat source 519 to apply heat to the coverlay-metal foil bi-layer while the bi-layer is still in the vacuum enclosure 510. The heat source 519 can include a $CO_2$ laser scanner (irradiating through transparent vacuum enclosure 510).

Figure 16:
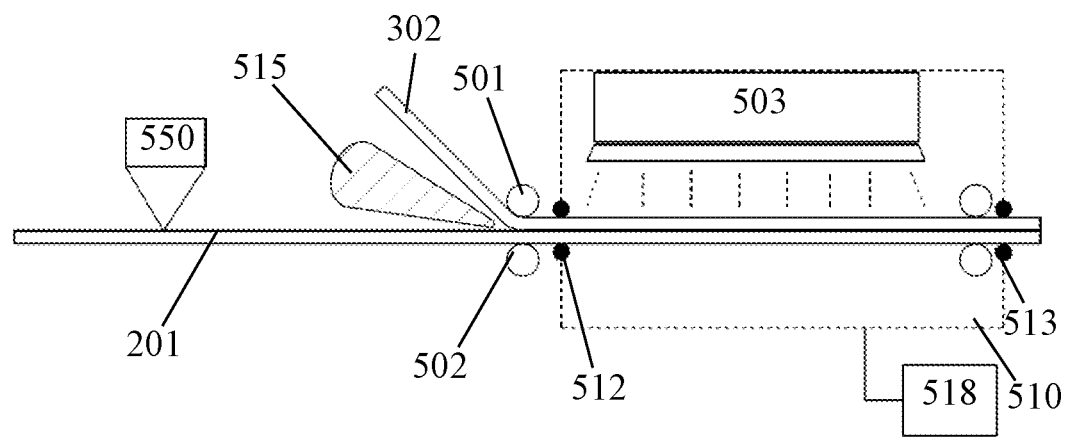
FIG. 16 is yet another simplified exemplar illustration of a workflow highlighting a lamination process using a vacuum source and a UV source, according one aspect of the disclosure.
Figure 17:
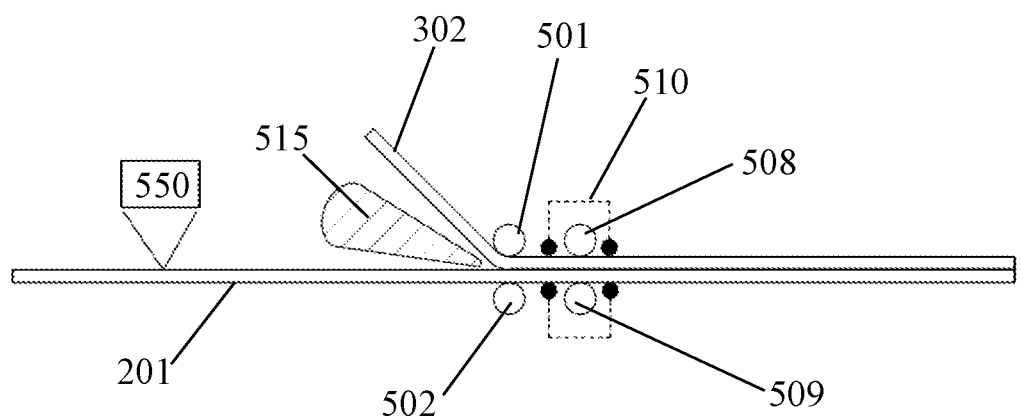
FIG. 17 is still another simplified exemplar illustration of a workflow highlighting a lamination process using a vacuum source and a heat source, according one aspect of the disclosure.

FIGS. 16 and 17 provide another two embodiments where the vacuum enclosure 510 has much more volume. In FIG. 16, vacuum enclosure 510 can contain a UV lamp 503. In FIG. 17, the vacuum enclosure 510 can contain a heated nip roller 508 and an anvil 509.

Reel-to-Reel Welding Device and Method

As illustrated in FIGS. 3 and 4, a multi-layer flexible printed circuit can be created with a reel-to-reel machine 6, 7. Part of this process may include electrically connecting at least two layers of circuitry patterns 221 together via a laser welding process.

Figure 18:
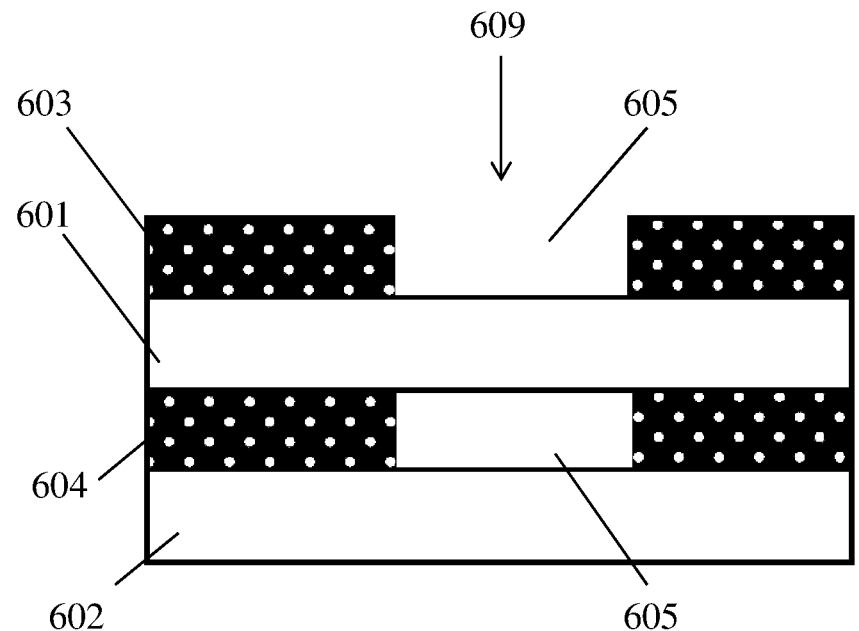
FIG. 18 is a simplified cross-sectional side view illustrating a multi-layer flexible printed circuit prior to a laser welding process, according one aspect of the disclosure.

Referring now to FIG. 18, before metal foil 601 and 602 are welded together at predetermined weld spots 609, the two metal foils 601 and 602 are layered together reel-to-reel. The two metal foils 601, 602 are separated by a dielectric layer 604. There can also be another dielectric layer 603 on the top of metal foil 601. These dielectric layers 603, 604 can be any dielectric sheet material such as a plastic laminate, a UV laminate, a thermoset laminate, or an adhesive layer.

In one embodiment of the novel welding method, there must be windows 605 disposed in dielectric layers 603, 604, thereby exposing the predetermined weld spot 609. As will be discussed later, there can be various ways to create windows 605. The window 605 in the dielectric layer 604 is especially important because this particular window 605 allows the two metal foils 601, 602 to physically touch or come close to each other after an embossing force is applied to the weld spot 609. As will be discussed in FIG. 21, an embossing force can be applied by a rotary embossing die 610 through the window 605 against an anvil, or an embossing stamp through the window 605 against an anvil or a flatbed on the fly.

Figure 19:
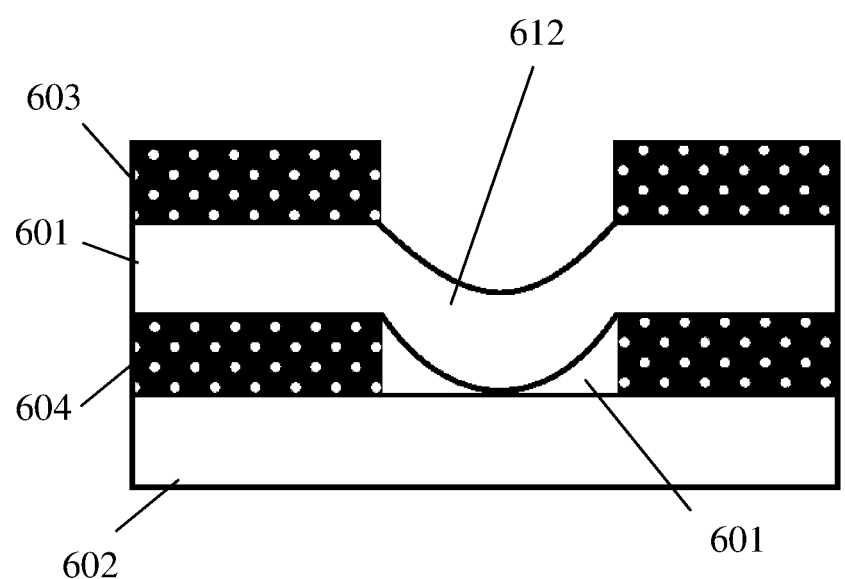
FIG. 19 is a simplified cross-sectional side view illustrating a multi-layer flexible printed circuit after an embossing step, according one aspect of the disclosure.

The embossing force deforms one or both of the metal foils 601, 602. In FIG. 19, top metal foil 601 has been embossed, thereby creating a deformation 612. Deformation 612 now physically touches the bottom metal foil 602 at the weld spot 609. A laser scanner 620 then irradiates the weld spot 609, effectively welding the two metal foils 601, 602 together at the weld spot 609. In another embodiment, the metal foil 601 can be deformed at the weld spot 609 but not necessarily touching the bottom metal foil 602. The key is to sufficiently deform metal foil 601 so that it is much closer to the metal foil 602 than had embossing not taken place.

Figure 21:
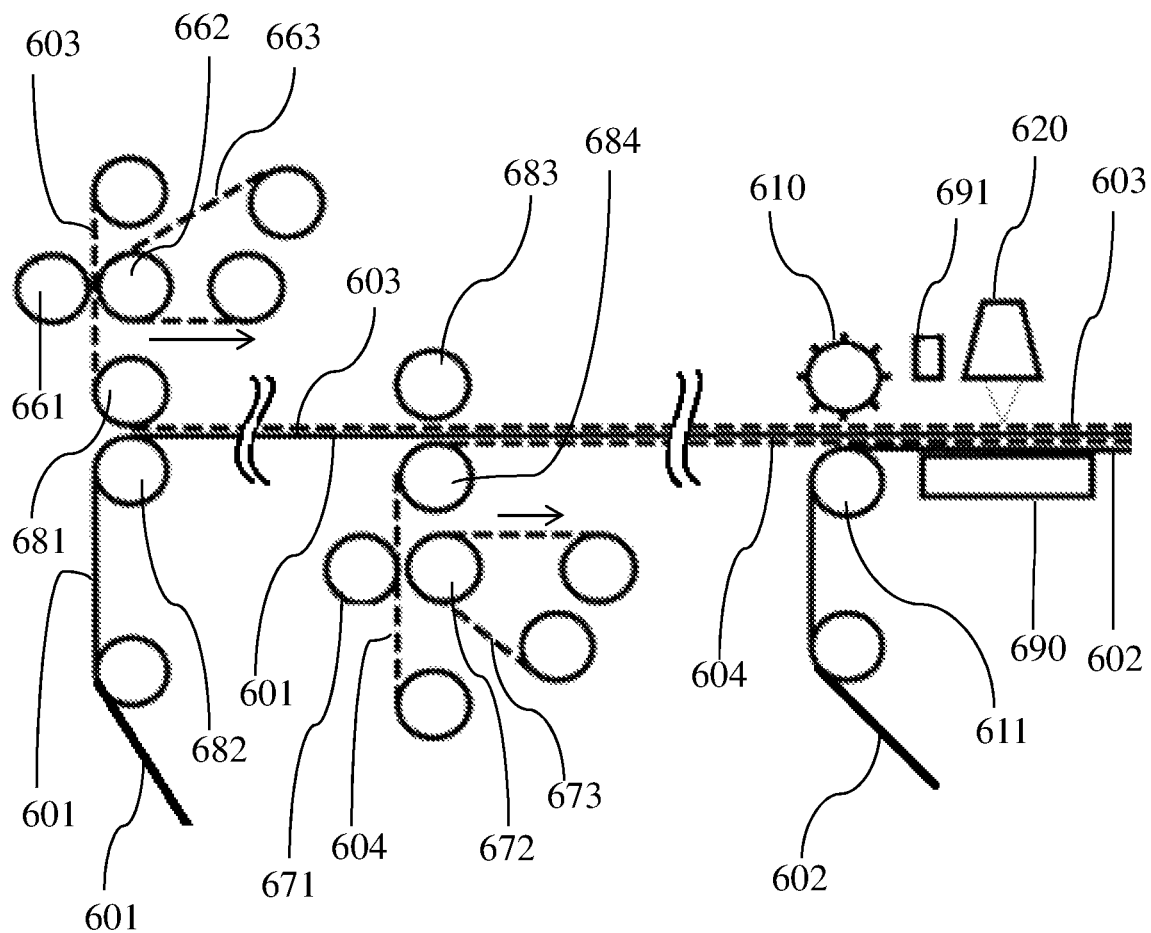
FIG. 21 is a simplified illustration of a workflow highlighting an embossing process and a welding process, according one aspect of the disclosure.

Referring now to FIG. 21, which illustrates the concept of FIGS. 18 and 19 in operation. For purposes of easier illustration, FIG. 21 shows only the welding process and does not illustrate other processes such as laser ablation, sintering, and slug removal.

The operation of FIG. 21 contemplates two metal foils 601, 602 separated by a dielectric layer 604 with an additional dielectric layer 603 on top of metal foil 601. This configuration is the same as the configuration shown in FIGS. 18 and 19.

Necessary windows 605 on predetermined spots of the top dielectric layer 603 can be prepared on the fly by using a rotary die cutter 661 and anvil 662 to make mechanical cuts at desired spots. Waste of the cut material can be removed from the top dielectric layer 603 using a sacrificial liner 663. Sacrificial liner 663 can have an adhesive sufficiently strong to adhere to the cut material and roll it away from the top dielectric layer 603 in the direction of the shown arrow.

Cutting of the window on the fly can be alternatively performed by a UV laser scanner or a CO2 laser scanner. Removal of waste material would be the same as describe above. In some embodiments, the windows are created prior to layering the first metal foil and/or the top dielectric layer 603 to the second metal foil 602. In some other embodiments, the windows are created after layering the first metal foil and/or the top dielectric layer 603 to the second metal foil 602.

Now that the top dielectric layer 603 has windows 605, the top dielectric layer 603 is transported reel-to-reel around reel 681 to lay on top of the first metal foil 601. As discussed elsewhere in this disclosure, known visualization or alignment devices can be used to make sure the windows 605 match up with the intended weld spots 609 on the first metal foil 601.

Necessary windows 605 on predetermined spots of the middle dielectric layer 604 can be prepared similarly on the fly. There can be a rotary die cutter 671 and anvil 672 to make mechanical cuts at desired spots. Waste of the cut material can be removed from the middle dielectric layer 604 using a sacrificial liner 673. Sacrificial liner 673 can have an adhesive sufficiently strong to adhere to the cut material and roll it away from the middle dielectric layer 604 in the direction of the shown arrow.

Now having windows 605 at desired spots, the middle dielectric layer 604 can be layered reel-to-reel around reel 684 to the bottom side of the first metal foil 601. Again, known visualization or alignment devices can be used to match the windows 605 to the intended weld spots 609 on the first metal foil 601.

This tri-layer continues its travel downstream the reel-to-reel conveyor system, and a second metal foil 602 is layered to the bottom side of the middle dielectric layer 604 via reel 611. Reel 611 can also act as an anvil to the debossing die 610. The debossing die 610 applies a debossing force through the windows 605 and deforms the first metal foil 601 as previously described. A Z height setter 690 and a Z height scanner 691 can be provided to measure the x, y, and z coordinates and makes proper alignment in real time to ensure proper welding of the weld spots 609.

Laser scanner 620 then irradiates through the windows 605 to the weld spots 609.

Figure 22:
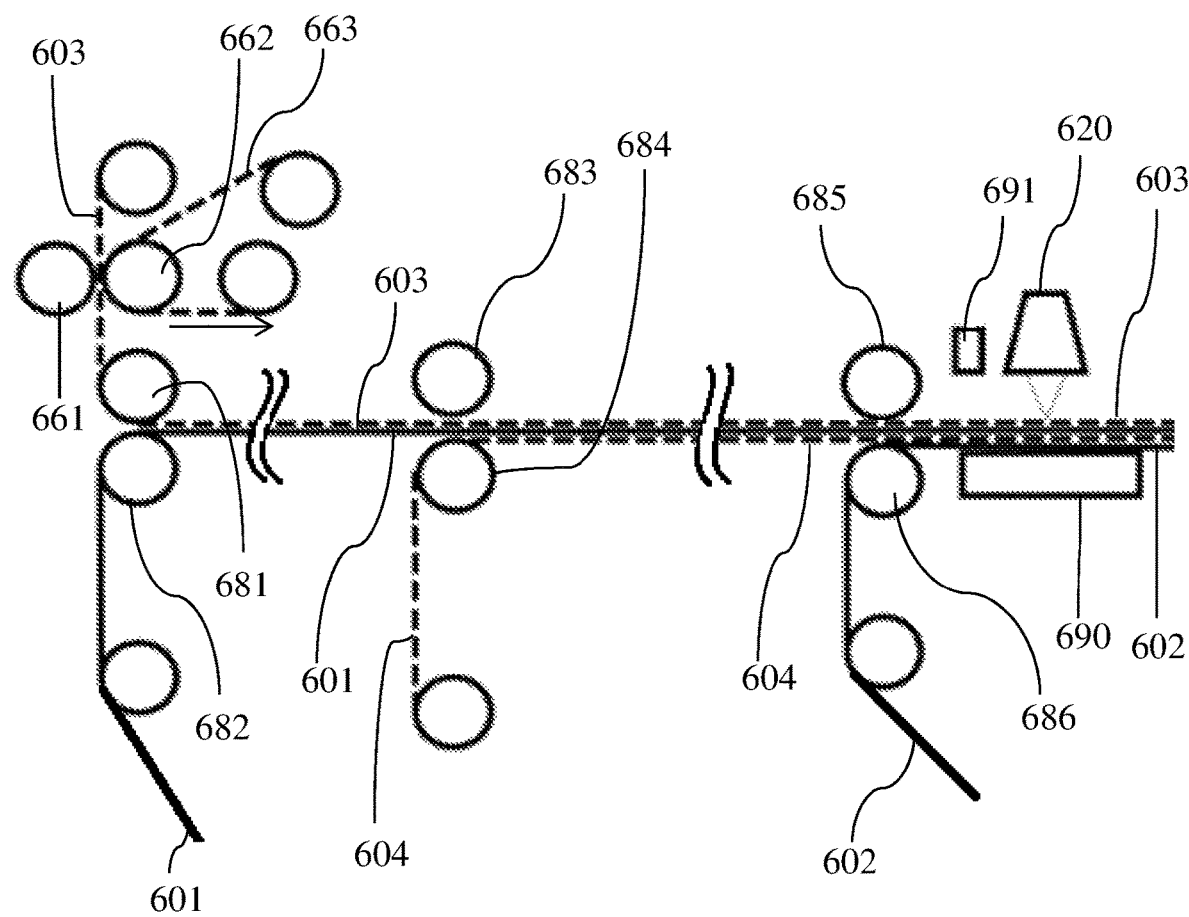
FIG. 22 is a simplified illustration of a workflow highlighting a laser welding process without embossing, according one aspect of the disclosure.

What is also not shown in FIG. 22 is any necessary components needed to laminate these layers together. It should be noted that any of the herein disclosed lamination steps can be implemented in FIG. 22. Dielectric layer 603, 604 can be a UV laminate or a thermoset laminate as described elsewhere in this disclosure.

The operation in FIG. 22 is different from FIG. 21 in that no embossing is used in FIG. 22. Here, only the top dielectric layer 603 has windows 605 created (similar to FIG. 21). The middle dielectric layer 604 does not have any windows. Laser scanner 620 would irradiate through windows 605 of the top dielectric layer 603 and directly onto the weld spots of the first metal foil 601. The weld spots of the first metal foil 601 would melt and displace and/or burn off some sections of the dielectric layer 604 directly underneath the weld spots of the first metal foil 601. The melted weld spot of the first metal foil 601 would reach the weld spot of the second metal foil 603, making an electrical connection.

Figure 20:
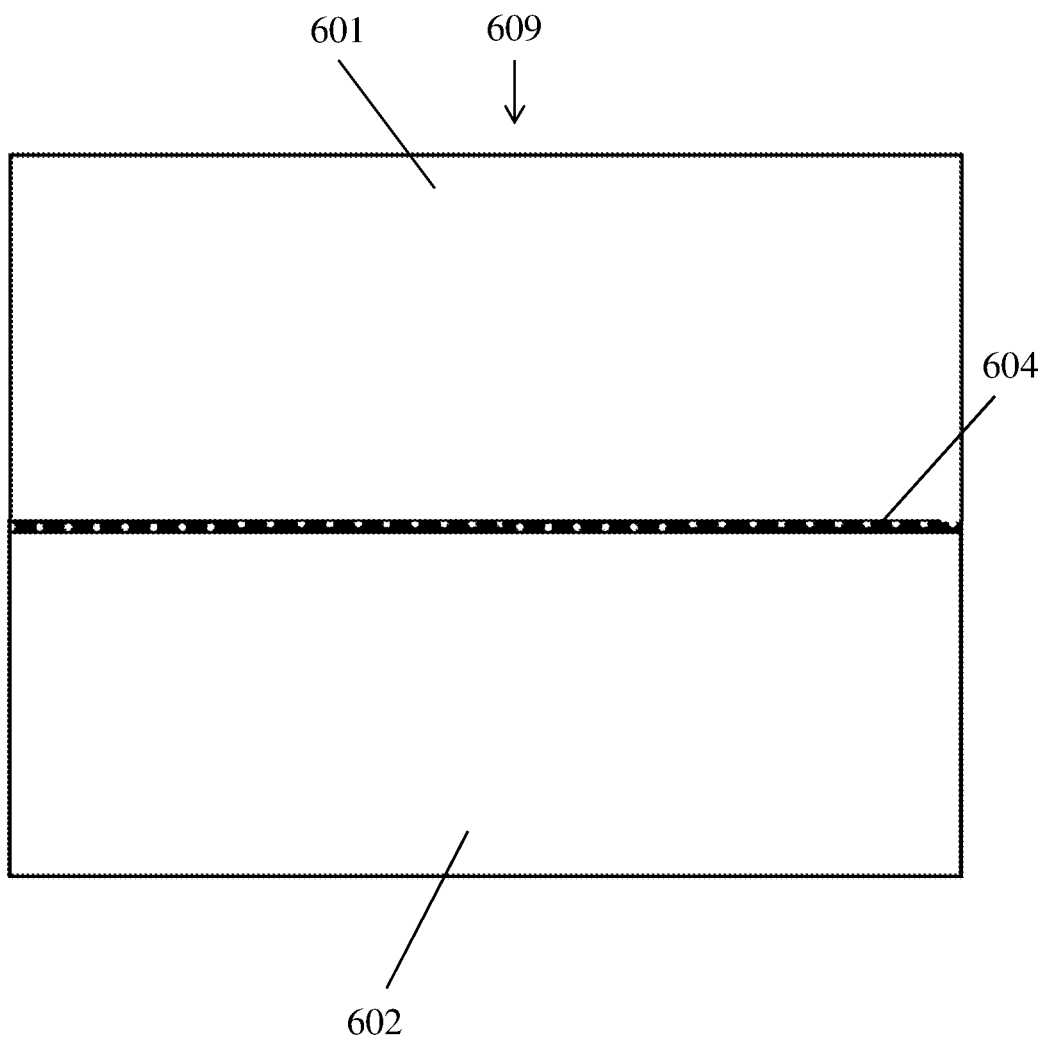
FIG. 20 is a simplified cross-sectional side view illustrating proportions between the various layers, according one aspect of the disclosure.

In one contemplated embodiment, this middle dielectric layer 604 can be an extremely thin layer of PSA (pressure sensitive adhesive). The contemplated PSA thickness is thinner than 10% of the thickness of the top metal foil 601 (see FIG. 20). The laser can irradiate the intended weld spots 609 on the first metal foil 601 to displace the adhesive locally and allow the two metal layers 601, 602 to weld together at the weld spot 609. In one contemplated example, several hundred watts CW fiber laser with galvanometer can be used with a wobble weld technique.

Figure 23:
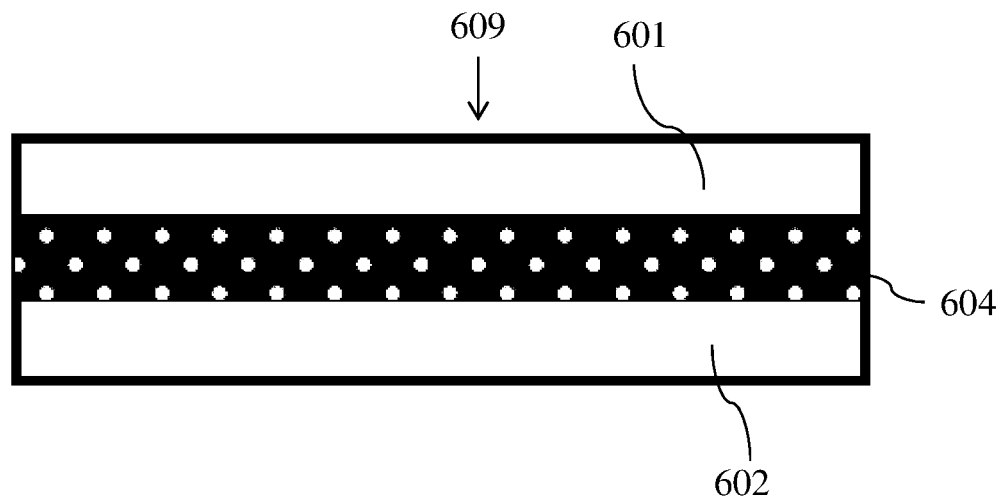
FIG. 23 is a simplified cross-sectional side view illustrating two metal foils prior to laser welding, according one aspect of the disclosure.
Figure 24:
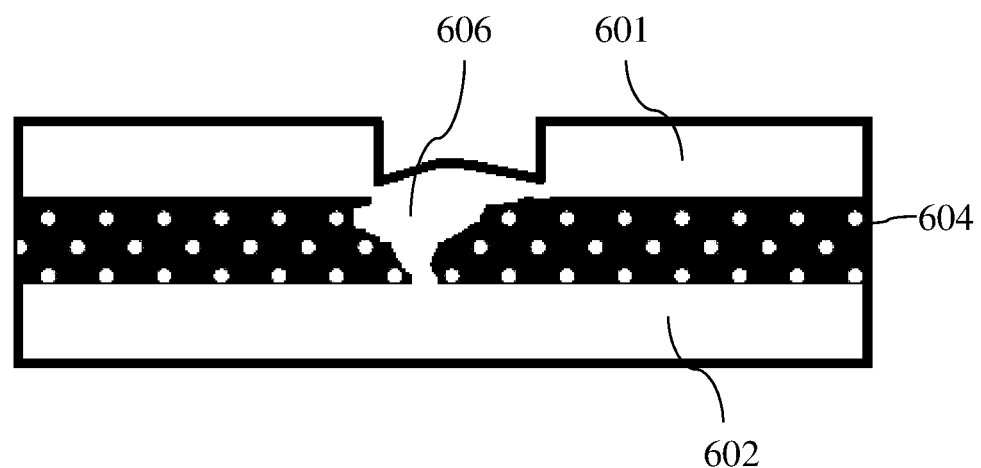
FIG. 24 is a simplified cross-sectional side view illustrating two metal foils after laser welding, according one aspect of the disclosure.

FIGS. 23 and 24 present a similar and more simplified representation as that shown in FIG. 22. Here, top dielectric layer 603 is not present. In other scenarios, the top dielectric layer 603 may be present but may or may not have windows 605 prepared. FIGS. 23 and 24 illustrates an embodiment where laser scanner (such as scanner 620 of FIG. 22) irradiates the intended weld spot 609 and creates molten metal 606 that displaces some part of the middle dielectric layer 604 to weld with the second metal foil 602. FIG. 24 shows the molten metal 606 after it is cooled. Molten metal 606 can conduct electricity between the first and second metal foils 601, 602, and can have sufficient and desirable properties (e.g., passing tests on peel force, thermal shock, salt FOG/Salt dunk tests).

Figure 25:
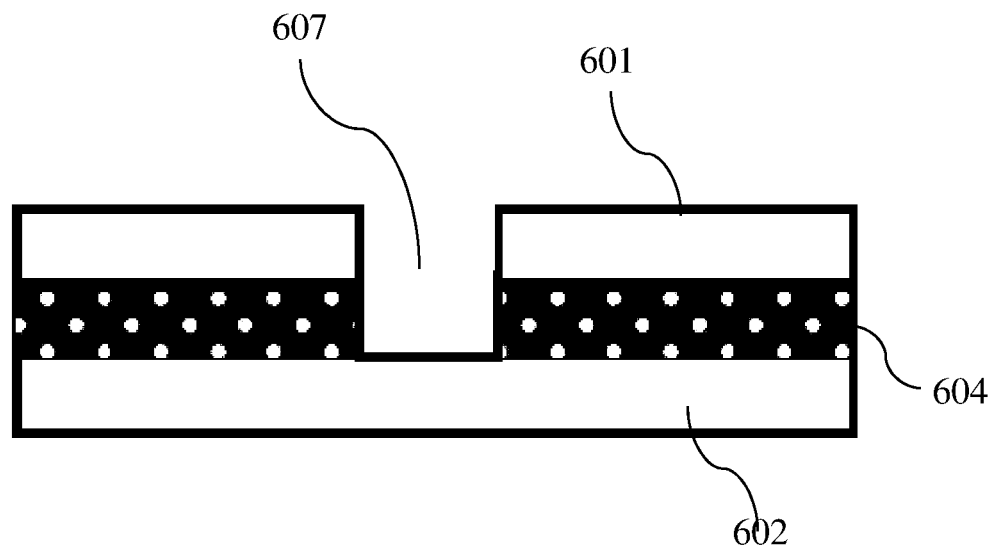
FIG. 25 is another simplified cross-sectional side view illustrating two metal foils prior to placement of a sintering paste, according one aspect of the disclosure.
Figure 26:
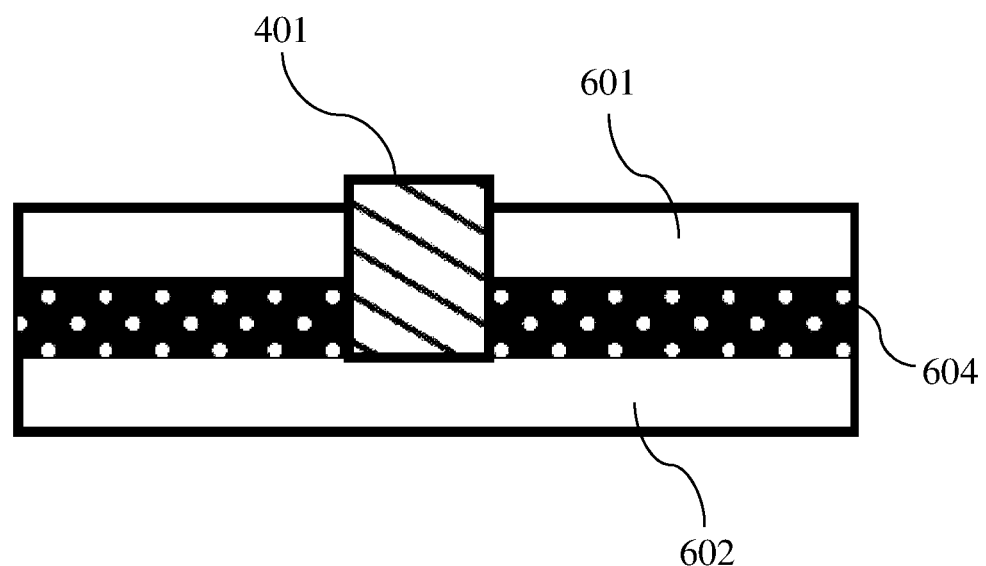
FIG. 26 is another simplified cross-sectional side view illustrating two metal foils after placement of a sintering paste, according one aspect of the disclosure.
Figure 27:
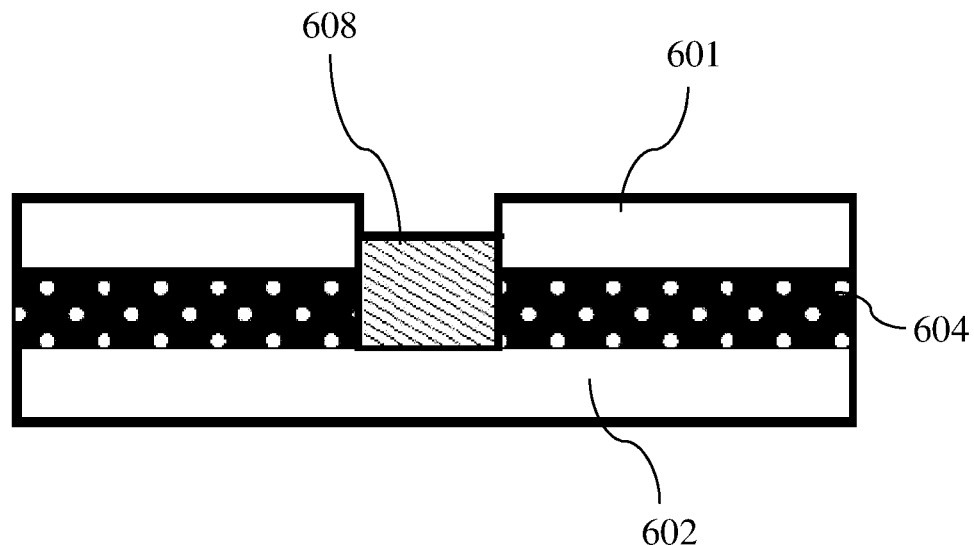
FIG. 27 is another simplified cross-sectional side view illustrating two metal foils after the sintering paste has been irradiated by laser, according one aspect of the disclosure.

FIGS. 25-27 illustrate yet another embodiment where sintering paste 401 can be used to achieve the same or similar result as welding. First, a laser scanner (e.g., laser scanner 620 in FIG. 22) irradiates the intended weld spot 609 and creates a hollow space 607. Hollow space 607 can also be created by a rotary die (not shown). There may be other instances where holes or through-holes may be necessary in any of the herein discloses processes. There can be provided any number of such laser scanner or rotary die to create holes or through-holes whenever and wherever necessary.

Hollow space 607 exposes the second metal foil 602. Sufficient radiation should be applied here so the intended weld spot 609 so there can be enough displacement of the first metal foil 601 and the middle dielectric layer 604, and it should not look like that shown in FIG. 24. Subsequently, sintering paste 401 (see FIG. 26) with metal filler can be placed into the hollow space 607 via a printer 401 (e.g., silk screening), or a sacrificial liner 406 as previously described in the novel sintering process. A vision system such as any of those discussed within this disclosure can be used to visualize and ensure accurate placement of the sintering paste 401. Further downstream from where sintering paste 401 has been placed into the hollow space 607, the tri-layer as shown in FIG. 26 is transferred reel-to-reel to another laser scanner 642 (see FIG. 28) to irradiate the sintering paste 401 on the fly. Yet another vision system 641 (see FIG. 28) can be provided to assist the laser scanner 642 for accurate irradiation of the sintering paste 401.

Figure 28:
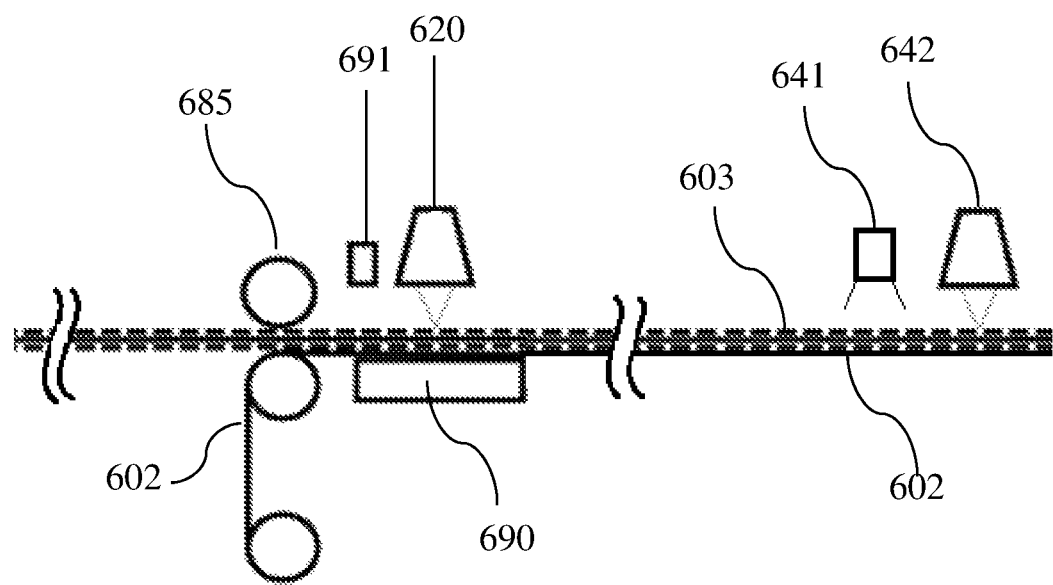
FIG. 28 is a simplified illustration of a reel-to-reel process of the sequence of steps in FIGS. 25-27, according one aspect of the disclosure.
Figure 29:
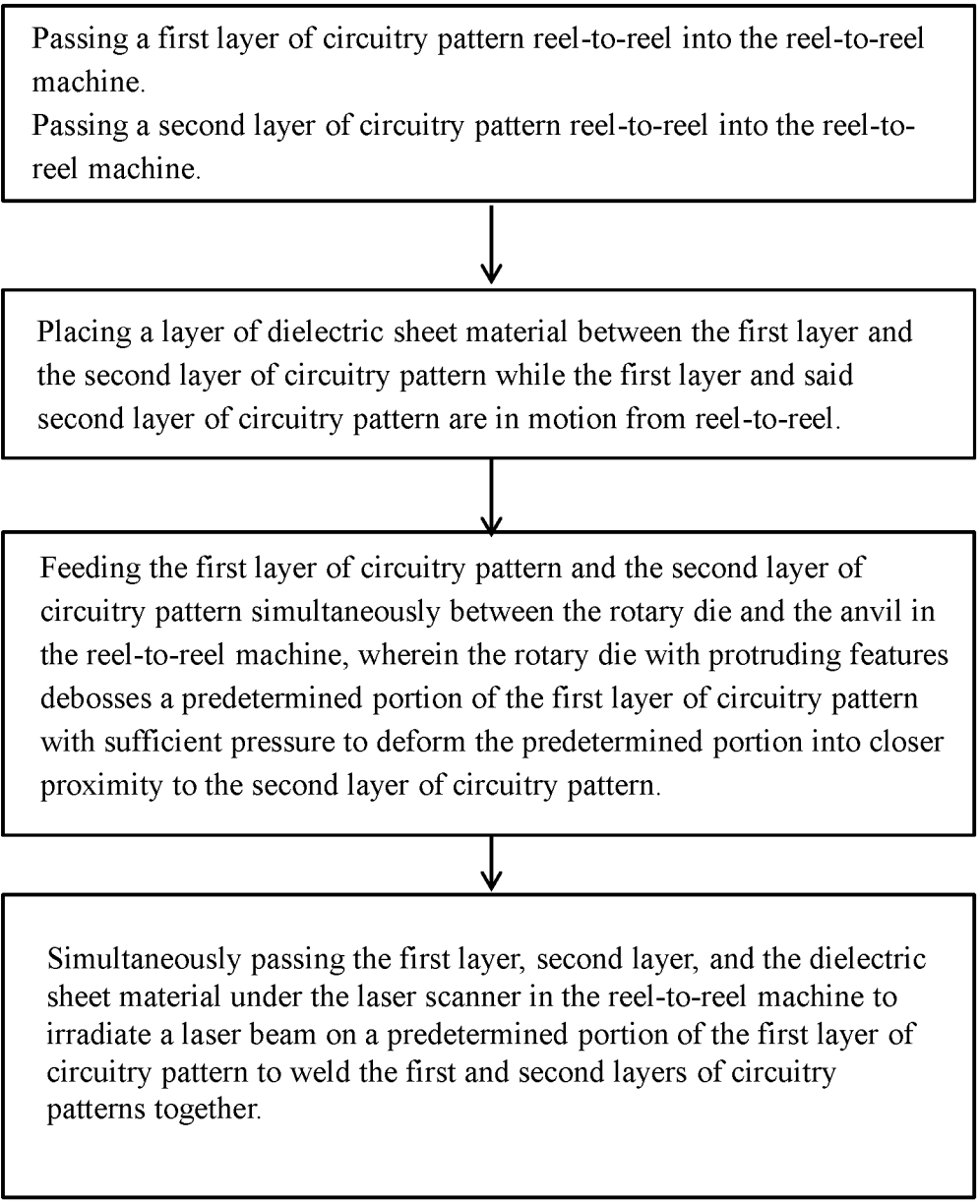
FIG. 29 is a flow diagram illustrating one contemplated method of a reel-to-reel process of laser welding, according one aspect of the disclosure.
Figure 30:
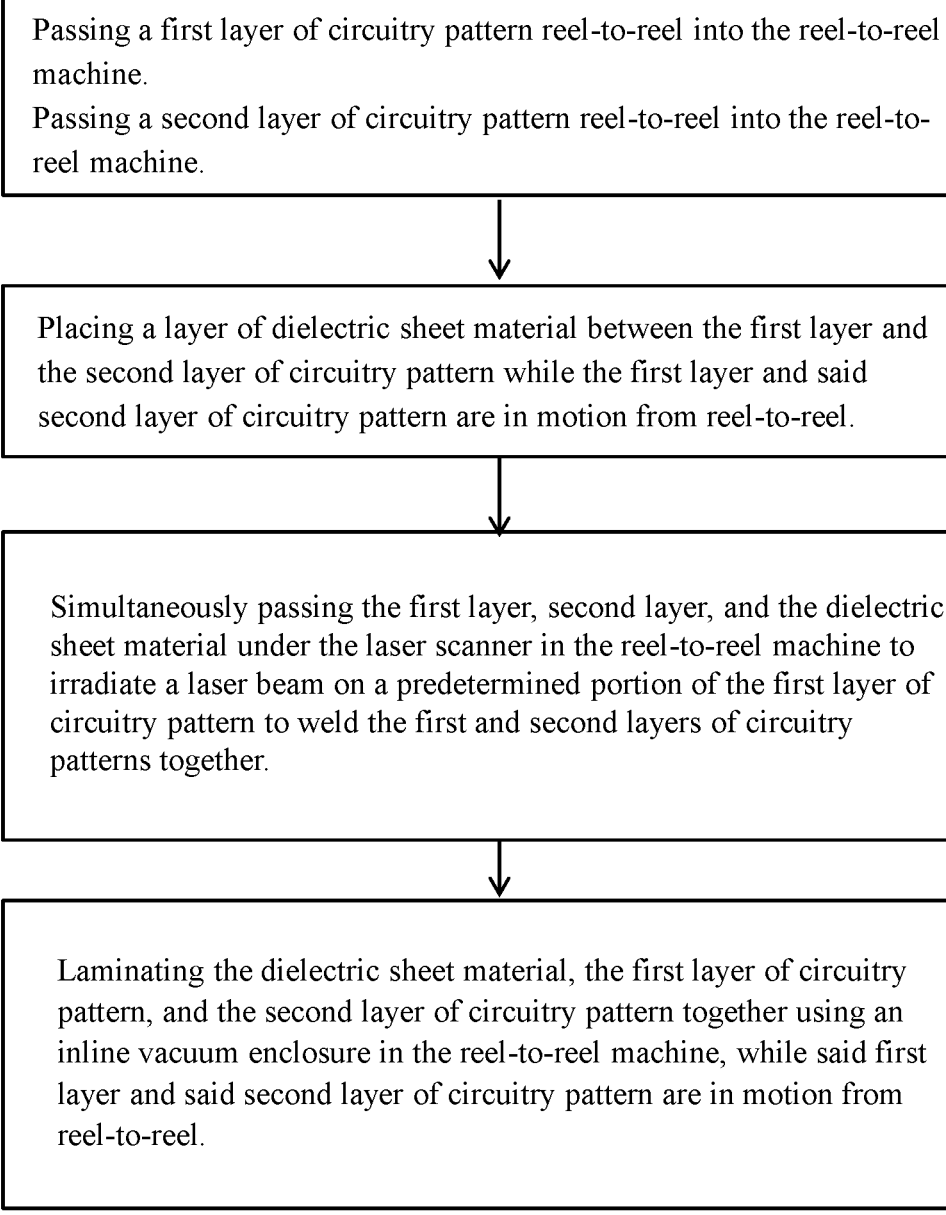
FIG. 30 is a flow diagram illustrating another contemplated method of a reel-to-reel process of laser welding, according one aspect of the disclosure.

In FIG. 28, prior to the laser sintering by laser scanner 642, laser scanner 620 can be performing ablation of the edges 222 of the circuitry pattern 221, a laser welding as described elsewhere in this disclosure, or creating a window 605 meant to receive the sinter paste 401 later.

As previously mentioned, many of the laser scanners and vision systems disclosed throughout this disclosure each discussed in the context of a different process (e.g., ablation, welding, sintering, separating tie bars, curing adhesives, debonding, applying heat, cleaning off debonding material, laminating a UV laminate) can be the same laser scanner and same vision system to perform two or more processes, so long as the sequential arrangement of them makes sense. For example, when a particular workflow is designed to have the process shown in FIG. 28 to occur immediately before the ablation shown in FIG. 5, vision system 641 and laser scanner 642 can perform the added function as vision system 205 and laser scanner 306.

Laser scanners have been disclosed in all of the above processes. The following table provides a summary of the contemplated laser types for each function:

| Function | Specification of Laser and Other Energy Sources |
|---|---|
| Laser Ablation | Pulsed Green laser. |
| | High-power Pulsed green laser. |
| | UV laser. |
| | Pulsed More precise green laser. |
| | CO2 laser. |
| | IR Pulsed Fiber laser (1 um) nanosecond, picosecond, and femtosecond |
| Debonding a UV Debonding Sheet | Violet laser. |
| | UV laser. |
| Debonding a Thermal debonding Sheet | CO2 laser. |
| | IR laser. |
| To Weld | Fiber laser. |
| | CW fiber laser (several hundred watts using a wobble weld technique). |
| To Cure an Adhesive in a Laminate Coverlay | UV LED (non-laser). |
| | UV Laser. |
| | Heat Roller. |
| | Heat Lamp. |
| | IR Lamp. |
| To Irradiate a Sintering Paste | CO2 Laser. |
| | Green Laser. |
| | Fiber laser. |
| To Clean/Remove Debonding Material/Debris | CO2 laser. |

Many alterations and modifications may be made by those having ordinary skill in the art without departing from the spirit and scope of the disclosed embodiments. Therefore, it must be understood that the illustrated embodiments have been set forth only for the purposes of example and that it should not be taken as limiting the embodiments as defined by the following claims. For example, notwithstanding the fact that the elements of a claim are set forth below in a certain combination, it must be expressly understood that the embodiment includes other combinations of fewer, more or different elements, which are disclosed herein even when not initially claimed in such combinations.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims therefore include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Thus, specific embodiments and applications of a novel reel-to-reel FPC fabrication process and its related individual novel steps have been disclosed. In interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements. The claims are thus to be understood to include what is specifically illustrated and described above, what is conceptually equivalent, what can be obviously substituted and also what essentially incorporates the essential idea of the embodiments. In addition, where the specification and claims refer to at least one of something selected from the group consisting of A, B, C . . . and N, the text should be interpreted as requiring at least one element from the group which includes N, not A plus N, or B plus N, etc.

What is claimed is:

1. A method of layering a first layer of circuitry pattern to a second layer of circuitry pattern during manufacturing of a multilayer flexible printed circuit in a reel-to-reel machine, the method comprising:

providing the reel-to-reel machine having a laser scanner;

passing said first layer of circuitry pattern reel-to-reel into the reel-to-reel machine;

passing the second layer of circuitry pattern reel-to-reel into the reel-to-reel machine;

placing a layer of dielectric sheet material between said first layer and said second layer of circuitry pattern while said first layer and said second layer of circuitry pattern are in motion from reel-to-reel;

simultaneously passing the first layer, second layer, and the dielectric sheet material under the laser scanner in the reel-to-reel machine to irradiate a laser beam on a predetermined portion of the first layer of circuitry pattern to weld said first and second layers of circuitry patterns together; and providing a rotary die and an anvil as part of the reel-to-reel machine, feeding the first layer of circuitry pattern and the second layer of circuitry pattern simultaneously between the rotary die and the anvil in the reel-to-reel machine, wherein the rotary die with protruding features debosses a predetermined portion of the first layer of circuitry pattern with sufficient pressure to deform the predetermined portion into closer proximity to the second layer of circuitry pattern.

2. The method as recited in claim 1, wherein the rotary die presses the predetermined portion of the first layer of circuitry pattern and the predetermined portion of the second layer of circuitry pattern to physically connect to each other.

3. The method as recited in claim 1, wherein the laser beam is comprised of a fiber laser.

4. The method as recited in claim 1, wherein at least one of the first layer of circuitry pattern and the second layer of circuitry pattern is made of a metal selected from a group consisting of a copper, an aluminum, a nickel, and stainless steel.

5. The method as recited in claim 4, wherein the dielectric sheet material is a pressure sensitive adhesive (PSA) having a thickness less than 10% of a thickness of the first layer of circuitry pattern.

6. The method as recited in claim 5, creating through windows in the dielectric sheet material prior to placing the dielectric sheet material between said first layer and said second layer of circuitry patterns.

7. The method as recited in claim 1, wherein the laser beam is sufficiently energized for the predetermined portion of the first layer of circuitry pattern to melt through the dielectric layer and make physical connection to the second layer of circuitry pattern.

8. The method as recited in claim 1 further comprising laminating the dielectric sheet material, the first layer of circuitry pattern, and the second layer of circuitry pattern together using an inline vacuum enclosure, while said first layer and said second layer of circuitry pattern are in motion from reel-to-reel.

9. A method of layering a first layer of circuitry pattern to a second layer of circuitry pattern during manufacturing of a multilayer flexible printed circuit in a reel-to-reel machine, the method comprising:

providing the reel-to-reel machine having a laser scanner;

passing said first layer of circuitry pattern reel-to-reel into the reel-to-reel machine;

passing the second layer of circuitry pattern reel-to-reel into the reel-to-reel machine;

placing a layer of dielectric sheet material between said first layer and said second layer of circuitry pattern while said first layer and said second layer of circuitry pattern are in motion from reel-to-reel;

simultaneously passing the first layer, second layer, and the dielectric sheet material under the laser scanner in the reel-to-reel machine to irradiate a laser beam on a predetermined portion of the first layer of circuitry pattern to weld said first and second layers of circuitry patterns together;

laminating the dielectric sheet material, the first layer of circuitry pattern, and the second layer of circuitry pattern together using an inline vacuum enclosure in the reel-to-reel machine, while said first layer and said second layer of circuitry pattern are in motion from reel-to-reel.

10. The method as recited in claim 9, providing a rotary die and an anvil as part of the reel-to-reel machine, feeding the first layer of circuitry pattern and the second layer of circuitry pattern simultaneously between the rotary die and the anvil in the reel-to-reel machine, wherein the rotary die with protruding features debosses a predetermined portion of the first layer of circuitry pattern with sufficient pressure to deform the predetermined portion into closer proximity to the second layer of circuitry pattern.

11. The method as recited in claim 10, wherein the rotary die presses the predetermined portion of the first layer of circuitry pattern and the predetermined portion of the second layer of circuitry pattern to physically connect to each other.

12. The method as recited in claim 10, wherein the laser beam is comprised of a fiber laser.

13. The method as recited in claim 10, wherein at least one of the first layer of circuitry pattern and the second layer of circuitry pattern is made of a metal selected from a group consisting of a copper, an aluminum, a nickel, and stainless steel.

14. The method as recited in claim 13, wherein the dielectric sheet material is a pressure sensitive adhesive (PSA) having a thickness less than 10% of a thickness of the first layer of circuitry pattern.

15. The method as recited in claim 14, creating through windows in the dielectric sheet material prior to placing the dielectric sheet material between said first layer and said second layer of circuitry patterns.

16. The method as recited in claim 9, wherein the laser beam is sufficiently energized for the predetermined portion of the first layer of circuitry pattern to melt through the dielectric layer and make physical connection to the second layer of circuitry pattern.

* * * * *